(12) United States Patent
Chen et al.

(10) Patent No.: US 11,948,949 B2
(45) Date of Patent: Apr. 2, 2024

(54) VERTICAL GATE FIELD EFFECT TRANSISTOR

(71) Applicant: Taiwan Semiconductor Manufacturing Company, Ltd., Hsin-Chu (TW)

(72) Inventors: Chun-Yuan Chen, Tainan (TW); Ching-Chun Wang, Tainan (TW); Hsiao-Hui Tseng, Tainan (TW); Jen-Cheng Liu, Hsin-Chu (TW); Jhy-Jyi Sze, Hsin-Chu (TW); Shyh-Fann Ting, Tainan (TW); Wei Chuang Wu, Tainan (TW); Yen-Ting Chiang, Tainan (TW); Chia Ching Liao, Tainan (TW); Yen-Yu Chen, Kaohsiung (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 17/865,623

(22) Filed: Jul. 15, 2022

(65) Prior Publication Data

US 2022/0352223 A1    Nov. 3, 2022

Related U.S. Application Data

(63) Continuation of application No. 16/736,134, filed on Jan. 7, 2020, now Pat. No. 11,404,460.

(51) Int. Cl.
*H01L 27/146* (2006.01)
*H01L 29/423* (2006.01)

(52) U.S. Cl.
CPC .. *H01L 27/14614* (2013.01); *H01L 27/14621* (2013.01); *H01L 27/14627* (2013.01);
(Continued)

(58) Field of Classification Search
CPC .......... H01L 27/14614; H01L 29/4236; H01L 29/7827; H01L 29/42376; H01L 29/785;
(Continued)

(56) References Cited

U.S. PATENT DOCUMENTS

| 2005/0151206 A1 | 7/2005 | Schwerin |
| 2006/0006446 A1 | 1/2006 | Schwerin |

(Continued)

FOREIGN PATENT DOCUMENTS

CN    102306661 A    1/2012

OTHER PUBLICATIONS

Wang et al. "Fixed-Pattern Noise Induced by Transmission Gate in Pinned 4T CMOS Image Sensor Pixels." 2006 European Solid-State Device Research Conference, published on Feb. 12, 2007.
(Continued)

*Primary Examiner* — Tucker J Wright
(74) *Attorney, Agent, or Firm* — Eschweiler & Potashnik, LLC

(57) ABSTRACT

In some embodiments, the present disclosure relates to a device having a semiconductor substrate including a frontside and a backside. On the frontside of the semiconductor substrate are a first source/drain region and a second source/drain region. A gate electrode is arranged on the frontside of the semiconductor substrate and includes a horizontal portion, a first vertical portion, and a second vertical portion. The horizontal portion is arranged over the frontside of the semiconductor substrate and between the first and second source/drain regions. The first vertical portion extends from the frontside towards the backside of the semiconductor substrate and contacts the horizontal portion of the gate electrode structure. The second vertical portion extends from the frontside towards the backside of the semiconductor substrate, contacts the horizontal portion of the gate
(Continued)

electrode structure, and is separated from the first vertical portion by a channel region of the substrate.

20 Claims, 22 Drawing Sheets

(52) U.S. Cl.
CPC .... *H01L 27/14636* (2013.01); *H01L 27/1464* (2013.01); *H01L 27/14645* (2013.01); *H01L 27/14689* (2013.01); *H01L 29/4236* (2013.01); *H01L 29/42376* (2013.01)

(58) Field of Classification Search
CPC ......... H01L 27/14603; H01L 29/42356; H01L 29/42372; H01L 2029/7858
See application file for complete search history.

(56) References Cited

U.S. PATENT DOCUMENTS

| | | |
|---|---|---|
| 2008/0108199 A1 | 5/2008 | Schwerin |
| 2012/0319196 A1 | 12/2012 | Kawaguchi |
| 2013/0099296 A1 | 4/2013 | Lyu et al. |
| 2017/0110562 A1 | 4/2017 | Chen |
| 2018/0012769 A1 | 1/2018 | Colinge et al. |

OTHER PUBLICATIONS

Non-Final Office Action dated Nov. 30, 2021 for U.S. Appl. No. 16/736,134.
Notice of Allowance dated Mar. 16, 2022 for U.S. Appl. No. 16/736,134.

2300

```
┌─────────────────────────────────────────────────────────────────┐
│ Form a first masking structure over a substrate, wherein an     │
│ opening in the first masking structure completely separates an  │──2302
│ inner region from an outer region of the first masking structure│
└─────────────────────────────────────────────────────────────────┘
                                ▼
┌─────────────────────────────────────────────────────────────────┐
│ Perform a first removal process to remove portions of the       │
│ substrate that directly underlie the opening of the first       │──2304
│ masking structure to form a trench structure in the substrate   │
└─────────────────────────────────────────────────────────────────┘
                                ▼
┌─────────────────────────────────────────────────────────────────┐
│           Form a gate dielectric layer over the substrate       │──2306
└─────────────────────────────────────────────────────────────────┘
                                ▼
┌─────────────────────────────────────────────────────────────────┐
│ Form a gate electrode structure within the trench structure     │──2308
│                 and over the trench structure                   │
└─────────────────────────────────────────────────────────────────┘
                                ▼
┌─────────────────────────────────────────────────────────────────┐
│      Form first and second source/drain regions on the substrate│──2310
└─────────────────────────────────────────────────────────────────┘
                                ▼
┌─────────────────────────────────────────────────────────────────┐
│ Form contact vias over the gate electrode structure, the first  │──2312
│ source/drain region, and the second source/drain region         │
└─────────────────────────────────────────────────────────────────┘
                                ▼
┌─────────────────────────────────────────────────────────────────┐
│ Form a heavily doped region continuously surrounding the gate   │
│ electrode structure and extending from a backside of the        │──2314
│ substrate to a frontside of the substrate                       │
└─────────────────────────────────────────────────────────────────┘
```

Fig. 23

VERTICAL GATE FIELD EFFECT TRANSISTOR

REFERENCE TO RELATED APPLICATION

This Application is a Continuation of U.S. application Ser. No. 16/736,134, filed on Jan. 7, 2020, the contents of which are hereby incorporated by reference in their entirety.

BACKGROUND

The integrated circuit (IC) manufacturing industry has experienced exponential growth over the last few decades. As ICs have evolved, functional density (e.g., the number of interconnected devices per chip area) has increased while feature sizes have decreased. One advance by the semiconductor industry to scale down semiconductor devices is the development of fin field-effect transistors (finFETs). While finFETs have several advantages over traditional planar transistors (e.g., reduced power consumption, smaller feature sizes, reduced noise, etc.), they come with a higher manufacturing cost. Thus, alternative options and/or methods for finFETs are being researched to reduce manufacturing costs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 23 illustrates a flow diagram of some embodiments corresponding to the method illustrated in FIGS. 18A-22C.

DETAILED DESCRIPTION

Figure 1A:
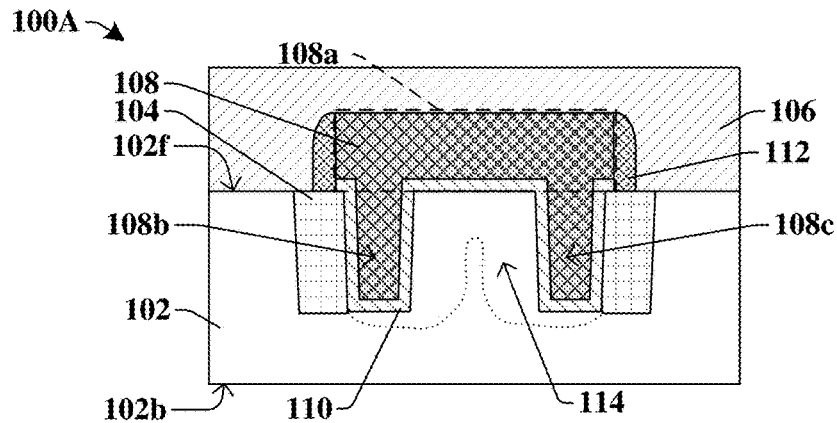
FIGS. 1A-1C illustrate various views of some embodiments of an integrated chip having a gate electrode structure comprising a first vertical portion and a second vertical portion connected by a horizontal portion.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some embodiments, a planar metal oxide semiconductor field effect transistor (MOSFET) comprises a planar gate electrode arranged over a channel region of a substrate, such that the planar gate electrode contacts a top surface of the channel region of the substrate. In other embodiments, to increase control of a transistor and reduce space, a fin field effect transistor (finFET) is used in electronic devices instead of a planar MOSFET. A finFET comprises a gate electrode that overlies and contacts a fin protruding from a substrate. The gate electrode of the finFET covers three surfaces of the channel region, which contributes to the higher control and lower noise provided in finFETs compared to planar MOSFETs. However, because of, for example, the formation of the fin, finFETs may have many more processing steps and thus may have a higher cost of production than planar MOSFETs. Thus, overall cost and performance requirements are considered when determining which type of transistor used in an electronic device. For example, in complementary metal oxide semiconductor (CMOS) image sensors, low noise is an important factor in device reliability. However, in a four transistor CMOS image sensor circuit, the cost of using finFETs in a CMOS image sensor is high.

Various embodiments of the present disclosure provide a vertical-gate transistor having a gate electrode structure that comprises a horizontal portion arranged over a frontside of the substrate, and first and second vertical portions extending from the horizontal portion and towards a backside of the substrate. In some embodiments, a channel region of the substrate is arranged below the horizontal portion and between the first and second vertical portions of the gate electrode structure. Thus, at least three surfaces of the channel region are surrounded by the gate electrode structure, thereby reducing noise and increasing device control. Advantageously, one additional masking structure and removal step is needed to form the gate electrode structure compared to the process for forming a planar MOSFET. Therefore, a vertical-gate transistor having the gate electrode structure that comprises a horizontal portion and first and second vertical portions may increase reliability of electronic devices without greatly increasing manufacturing costs.

FIG. 1A illustrates a cross-sectional view 100A of some embodiments of an integrated chip comprising a gate electrode structure with a horizontal portion and vertical portions.

The integrated chip in the cross-sectional view 100A includes a gate electrode structure 108 within a dielectric structure 106 and arranged over a frontside 102f of a substrate 102. The dielectric structure 106 may be arranged over and contact the substrate 102. A gate dielectric layer 110 separates the gate electrode structure 108 from contacting the substrate 102. In some embodiments, the substrate 102 may comprise, for example, a semiconductor material (e.g., Si, Ge, SiGe, etc.) having a first doping type. In other embodiments (not shown), the substrate 102 may comprise a doped well region below the gate electrode structure 108 and having the first doping type.

In some embodiments, from the cross-sectional view 100A, the gate electrode structure 108 may comprise a horizontal portion 108a arranged over the frontside 102f of the substrate 102; a first vertical portion 108b directly underlying the horizontal portion 108a and extending from the frontside 102f of the substrate 102 and towards a backside 102b of the substrate 102; and a second vertical portion 108c directly underlying the horizontal portion 108a and extending from the frontside 102f of the substrate 102 and towards the backside 102b of the substrate 102. In some embodiments, the first vertical portion 108b and the second vertical portion 108c directly contact the horizontal portion 108a of the gate electrode structure 108. Further, in some embodiments, the first vertical portion 108b and the second vertical portion 108c completely and directly underlie the horizontal portion 108a of the gate electrode structure 108. The gate dielectric layer 110 may be a continuously connected layer from the cross-sectional view 100A that separates the horizontal portion 108a, the first vertical portion 108b, and the second vertical portion 108c of the gate electrode structure 108 from the substrate 102.

In some embodiments, a sidewall spacer structure 112 surrounds outermost sidewalls of the gate electrode structure 108. The sidewall spacer structure 112 may comprise a dielectric material such as, for example, silicon nitride, silicon dioxide, silicon carbide, silicon oxynitride, or the like. In some embodiments, the sidewall spacer structure 112 is arranged beside the gate dielectric layer 110 and does not directly overlie the gate dielectric layer 110, whereas in other embodiments, the sidewall spacer structure 112 may directly overlie the gate dielectric layer 110. The sidewall spacer structure 112 may provide structural and/or electrical protection to the gate electrode structure 108, in some embodiments.

In some embodiments, a trench isolation structure 104 is arranged within the substrate 102 and extends towards the backside 102b of the substrate 102 from the frontside 102f of the substrate 102. In some embodiments, the trench isolation structure 104 comprises the first doping type, whereas in other embodiments, the trench isolation structure 104 comprises a second doping type different than the first doping type. In yet some other embodiments, the trench isolation structure 104 is not doped. In some embodiments, the trench isolation structure 104 is or comprises a shallow trench isolation (STI) structure, and thus, does not extend through the substrate 102 to the backside 102b of the substrate 102. In some embodiments, the trench isolation structure 104 directly underlies the sidewall spacer structure 112 in the cross-sectional view 100A. In other embodiments, the trench isolation structure 104 may be spaced apart from the gate electrode structure 108 and gate dielectric layer 110 by, for example, the substrate 102. Further, in some embodiments, the trench isolation structure 104 is arranged beside outermost sidewalls of the first and second vertical portions 108b, 108c of the gate electrode structure 108.

In some embodiments, when the gate electrode structure 108 is turned "ON," a voltage or current is applied to the gate electrode structure 108 to push away the majority charge carriers, such that the minority charge carries remain in a channel region 114 of the substrate 102. For example, if the substrate 102 is p-type, when a positive voltage is applied to the gate electrode structure 108, positive charge carriers (e.g., holes) migrate away from the gate electrode structure 108 and towards the backside 102b of the substrate 102, such that negative charge carriers (e.g., electrons) remain in the channel region 114. The trench isolation structure 104 may prevent or mitigate leakage of current that travels through the channel region 114. Because of the first and second vertical portions 108b, 108c, the channel region 114 is larger than if the gate electrode structure 108 only comprised the horizontal portion 108a. Therefore, the gate electrode structure 108 comprising the horizontal portion 108a, first vertical portion 108b, and second vertical portion 108c may reduce power consumption and noise, thereby increasing control and reliability of the overall device. Further, it will be appreciated that other variations of the structure and/or materials of FIG. 1A are also within the scope of the disclosure.

Figure 1B:
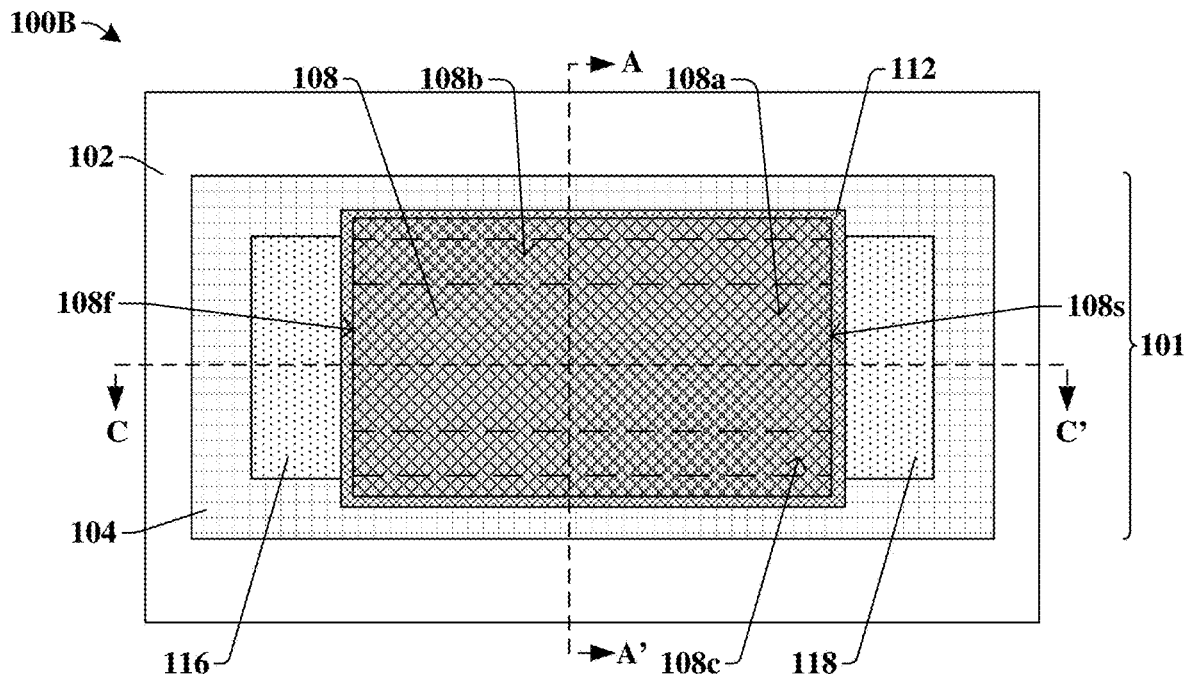

FIG. 1B illustrates top-view 100B of some embodiments of the integrated chip of FIG. 1A comprising a gate electrode structure with a horizontal portion and vertical portions. In some embodiments, the top-view 100B corresponds to a top-view perspective of the cross-sectional view 100A of FIG. 1A, excluding the dielectric structure 106 of FIG. 1A. In some embodiments, cross-section line AA' in FIG. 1B corresponds to the cross-sectional view 100A of FIG. 1A.

In some embodiments, the trench isolation structure 104 is a continuously connected ring-like structure that completely surrounds the gate electrode structure 108. In some embodiments, the gate electrode structure 108 partially overlaps with the trench isolation structure 104. In some embodiments, from the top-view 100B, the first and second vertical portions 108b, 108c of the gate electrode structure 108 are covered up by the horizontal portion 108a of the gate electrode structure 108. Thus, in the top-view 100B, the first and second vertical portions 108b, 108c are illustrated with dotted lines are understood to be behind the horizontal portion 108a of the gate electrode structure 108.

Figure 1C:
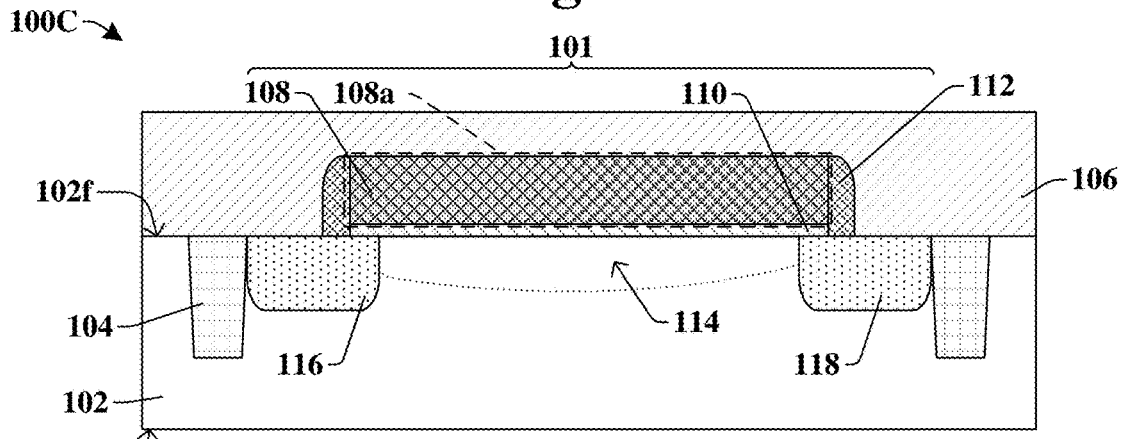

In some embodiments, a first source/drain region 116 is arranged on a first side 108f of the gate electrode structure 108, and a second source/drain region 118 is arranged on a second side 108s of the gate electrode structure 108. The first source/drain region 116, the second source/drain region 118, and the gate electrode structure 108 are a part of a vertical-gate transistor 101. In some embodiments, the trench isolation structure 104 also surrounds the first and second source/drain regions 116, 118. The first and second source/drain regions 116, 118 have the second doping type that is opposite to the first doping type of the channel region (114 of FIG. 1A). For example, in some embodiments, the channel region (114 of FIG. 1A) is p-type and the first and second source/drain regions 116, 118 are n-type. Thus, in some embodiments, when the vertical-gate transistor 101 is turned "ON," negative mobile charge carriers (e.g., electrons) may travel from the first source/drain region 116 to the second source/drain region 118 through the channel region (114 of FIG. 1A). The trench isolation structure 104 may also surround the first and second source/drain regions 116, 118 to prevent leakage of the current traveling between the first and second source/drain regions 116, 118. It will be appreciated that other isolation structures are also within the scope of the disclosure FIG. 1C illustrates a cross-sectional view 100C of some embodiments of an integrated chip comprising the vertical-gate transistor 101 corresponding to cross-section line CC' of FIG. 1B.

In some embodiments, from the perspective of the cross-sectional view 100C, the first and second vertical portions (108b, 108c of FIG. 1A) of the gate electrode structure 108 may not be visible. Further, when the vertical-gate transistor 101 is turned "ON," mobile charge carriers flow between the first and second source/drain regions 116, 118 through the channel region 114. It will be appreciated that in the cross-sectional view 100A of FIG. 1A, the mobile charge carriers would travel in a direction that is into or out of the page in the channel region 114. Thus, from the cross-sectional view 100A of FIG. 1A, because of the first and second vertical portions (108b, 108c) of the gate electrode structure 108, the channel region 114 is larger that depicted in the cross-sectional view 100C of FIG. 1C. Further, although not shown, in some embodiments, a contact via is coupled to each of the first source/drain region 116, the gate electrode structure 108, and the second source/drain region 118 to operate the vertical-gate transistor 101.

Figure 2A:
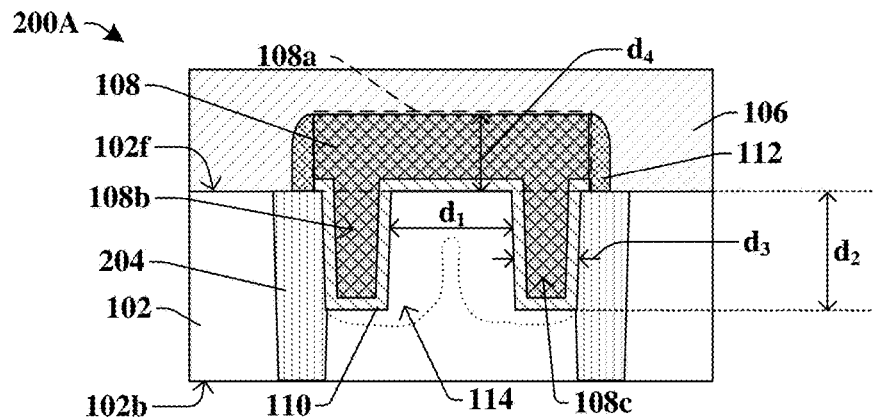
FIGS. 2A-2C illustrate various views of some embodiments of an integrated chip having a gate electrode structure comprising a horizontal portion arranged over a vertical portion, wherein the vertical portion of the gate electrode structure is a continuously connected ring-like structure.

FIG. 2A illustrates a cross-sectional view 200A of some alternative embodiments of an integrated chip having a vertical-gate transistor comprising a gate electrode structure with horizontal and vertical portions.

In some embodiments, the gate electrode structure 108 is surrounded by a heavily doped region 204 of the substrate 102. In some embodiments, the heavily doped region 204 extends completely through the substrate 102, or in other words, extends from the frontside 102f of the substrate 102 to the backside 102b of the substrate 102. In some embodiments, the heavily doped region 204 comprises the first doping type and comprises a same material as the substrate 102. Further, in some embodiments, the heavily doped region 204 of the substrate 102 has a higher concentration of the first doping type than other portions of the substrate 102. The heavily doped region 204 is configured to prevent current leakage from the vertical-gate transistor during operation. It will be appreciated that other isolation structures other than the heavily doped region 204 such as shallow trench isolation structures or backside deep trench isolation structures that surround the gate electrode structure 108 of FIG. 2A are also within the scope of the disclosure.

The heavily doped region 204 may be more effective in preventing current leakage during operation compared to the trench isolation structure (104 of FIG. 1A), in some embodiments; however, in some embodiments, manufacturing the heavily doped region 204 may have a higher cost than the trench isolation structure (104 of FIG. 1A).

Figure 2B:
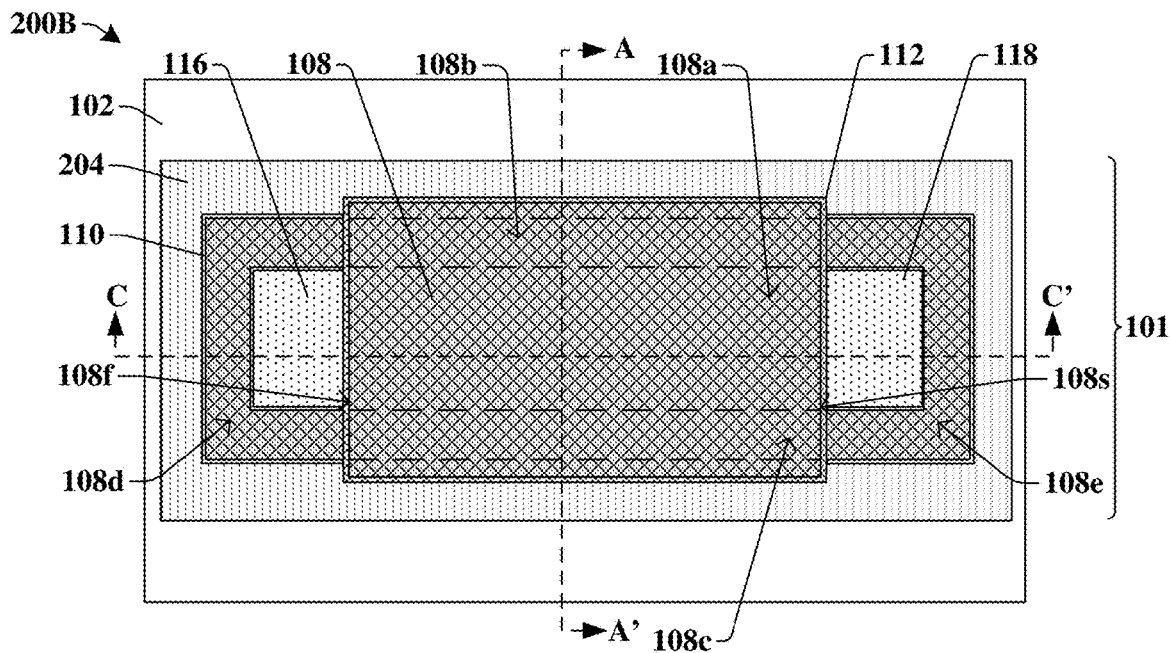

In some embodiments, inner sidewalls of the first vertical portion 108b and the second vertical portion 108c of the gate electrode structure 108 may be spaced apart from one another by a first distance $d_1$. The first distance $d_1$, in some embodiments, may be in a range of between, for example, approximately 1 nanometer and approximately 1000 nanometers. In some embodiments, the first and second vertical portions 108b, 108c of the gate electrode structure 108 may each have a bottom surface at a second distance $d_2$ from the frontside 102f of the substrate 102. In some embodiments, the second distance $d_2$ may be in a range of between, for example, approximately 1 nanometer and approximately 1 micrometer. Further, in some embodiments, each of the first and second vertical portions 108b, 108c have a width equal to a third distance $d_3$. In some embodiments, the third distance $d_3$ is in a range of, for example, between approximately 10 nanometers and approximately 1 micrometer. In some embodiments, the horizontal portion 108a of the gate electrode structure 108 may have a height equal to a fourth distance $d_4$ measured from the frontside 102f of the substrate to a top surface of the horizontal portion 108a of the gate electrode structure 108. In some embodiments, the fourth distance $d_4$ is in a range of between, for example, approximately 20 nanometers and approximately 400 nanometers. In some embodiments, measurements of the first through fourth distances $d_1$-$d_4$ may include the gate dielectric layer 110. In some embodiments, the gate dielectric layer 110 has a thickness in a range of between, for example, approximately 1 nanometer and approximately 50 nanometers. It will be appreciated that other values for the first through fourth distances $d_1$-$d_4$ are also within the scope of the disclosure FIG. 2B illustrates a top-view 200B of some embodiments of the integrated chip of FIG. 1B comprising a gate electrode structure with a horizontal portion and vertical portions. In some embodiments, the top-view 200B corresponds to a top-view perspective of the cross-sectional view 200A of FIG. 2A, excluding the dielectric structure 106 of FIG. 2A. In some embodiments, cross-section line AA' in FIG. 2B corresponds to the cross-sectional view 200A of FIG. 2A.

As illustrated in the top-view 200B of FIG. 2B, in some embodiments, the gate electrode structure 108 further comprises a third vertical portion 108d and a fourth vertical portion 108e. The third vertical portion 108d may surround portions of the first source/drain region 116 and may connect a first side of the first vertical portion 108b of the gate electrode structure 108 to a first side of the second vertical portion 108c of the gate electrode structure 108. The fourth vertical portion 108e may surround portions of the second source/drain region 118 and may connect a second side of the first vertical portion 108b of the gate electrode structure 108 to a second side of the second vertical portion 108c of the gate electrode structure 108. Thus, in some embodiments, the gate electrode structure 108 comprises a continuously connected vertical ring-line portion comprising the first through fourth vertical portions 108b-108e. Further, the third and fourth vertical portions 108d, 108e are surrounded by the heavily doped region 204.

Figure 2C:
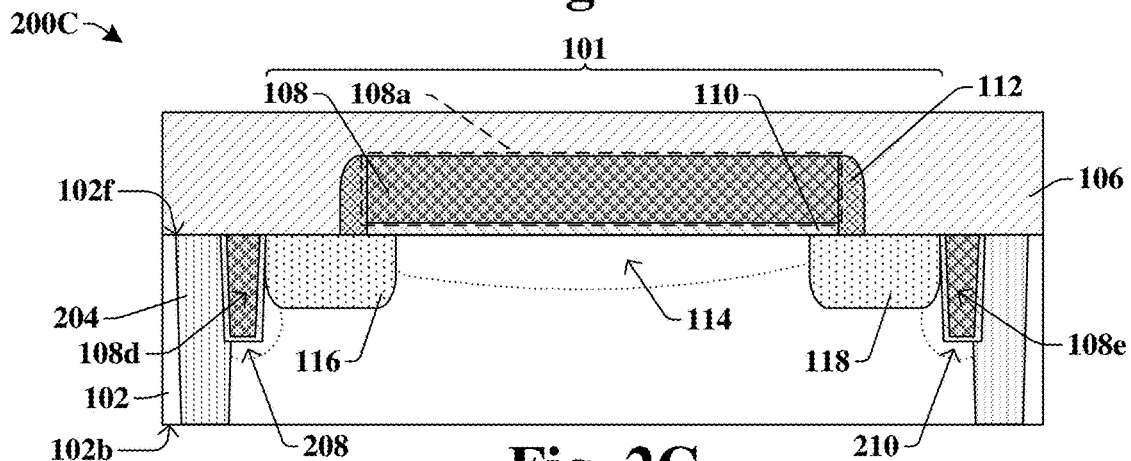

FIG. 2C illustrates a cross-sectional view 200C of some embodiments of an integrated chip comprising the vertical-gate transistor 101 corresponding to cross-section line CC' of FIG. 2B.

In some embodiments, from the perspective of the cross-sectional view 200C, the first and second vertical portions (108b, 108c of FIG. 2A) of the gate electrode structure 108 may not be visible. Although the third and fourth vertical portions 108d, 108e are spaced apart from the horizontal portion 108a of the gate electrode structure 108, the third and fourth vertical portions 108d, 108e of the gate electrode structure 108 are electrically coupled to the horizontal portion 108a of the gate electrode structure 108. Further, the gate dielectric layer 110 also separates the third and fourth vertical portions 108d, 108e of the gate electrode structure 108 from the substrate 102. In some embodiments, although not visible from the perspective of the cross-sectional view 200C of FIG. 2C, the gate dielectric layer 110 contacting the third vertical portion 108d of the gate electrode structure 108, the fourth vertical portion 108e of the gate electrode structure 108, and the horizontal portion 108a of the gate electrode structure 108 is a same, continuously connected layer.

In some embodiments, when the vertical-gate transistor 101 is turned "ON," the channel region 114 is formed below the horizontal portion 108a of the gate electrode structure 108, and mobile charge carriers can travel between the first and second source/drain regions 116, 118. Further, a first additional channel region 208 may form below the third vertical portion 108d of the gate electrode structure 108, and a second additional channel region 210 may form below the fourth vertical portion 108e of the gate electrode structure 108. In some embodiments, the heavily doped region 204 prevents mobile charge carriers from leaking away from the vertical-gate transistor 101 during operation. If the heavily doped region 204 did not extend below the third and fourth vertical portions 108d, 108e of the gate electrode structure 108, leakage of mobile charge carriers in the first additional channel region 208 and the second additional channel region 210 may occur. In some embodiments, the heavily doped region 204 comprises a first doping type that is the same as the first doping type of the substrate 102. In some embodiments, the heavily doped region 204 may have a higher concentration of dopants than the substrate 102 such that even when the vertical-gate transistor 101 is turned "ON," a channel region may not form in the heavily doped region 204.

Further, it will be appreciated that in the cross-sectional view 200A of FIG. 2A, the mobile charge carriers would travel in a direction that is into or out of the page in the channel region 114. Thus, from the cross-sectional view 200A of FIG. 2A, because of the first and second vertical portions (108b, 108c) of the gate electrode structure 108, the channel region 114 is larger that depicted in the cross-sectional view 200C of FIG. 2C. Further, although not shown, in some embodiments, a contact via is coupled to each of the first source/drain region 116, the gate electrode structure 108, and the second source/drain region 118 to operate the vertical-gate transistor 101.

Figure 3:
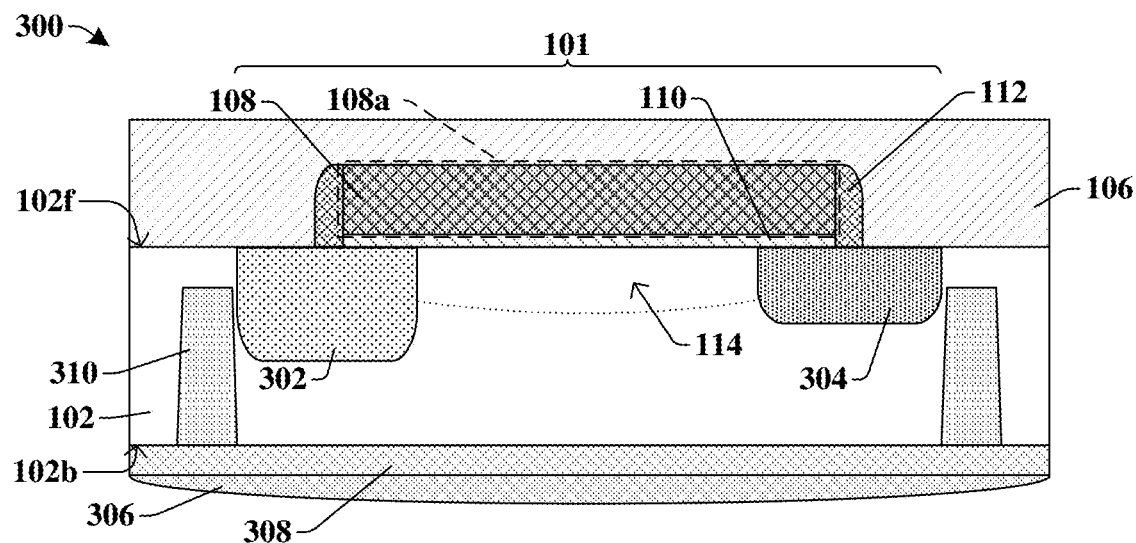
FIG. 3 illustrates a cross-sectional view of some embodiments of an image sensor having a gate electrode structure comprising a first vertical portion and a second vertical portion connected by a horizontal portion.

FIG. 3 illustrates a cross-sectional view 300 of some alternative embodiments of the integrated chip of FIG. 1C, wherein the integrated chip of the cross-sectional view 300 is a complementary metal-oxide-semiconductor (CMOS) image sensor. Thus, the cross-sectional view 300 of FIG. 3 may correspond to alternative embodiments corresponding to cross-section line CC' of FIG. 1B.

In some embodiments, the image sensor in the cross-sectional view 300 comprises the vertical-gate transistor 101 having a gate electrode structure 108. The gate electrode structure 108 may comprise the horizontal portion 108a over the substrate 102, and first and second vertical portions (108b, 108c of FIG. 1A). In some embodiments, the gate electrode structure 108 may be or comprise a transfer gate electrode, wherein the gate electrode structure 108 overlies a photodiode 302 and a floating diffusion (FD) node 304. In some embodiments, the gate electrode structure 108 may be or comprise, for example, doped polysilicon and/or some other suitable conductive material(s), such as a metal comprising copper, tungsten, aluminum or others.

In some embodiments, the photodiode 302 and the FD node 304 may be spaced apart from one another by the channel region 114. In some embodiments, the photodiode 302 may have a second doping type that is opposite to the first doping type of the substrate 102. The photodiode 302 and the substrate 102 may contact one another thereby forming a photojunction. In other embodiments, the photodiode 302 may have a first region having the first doping type and may have a second region having the second doping type, wherein the first and second regions form the photojunction. The FD node 304 may have the same, second doping type as the photodiode 302, and thus, may have an opposite doping type to the substrate 102.

In some embodiments, an optical structure 308 is arranged on the backside 102b of the substrate 102, and a microlens 306 is arranged on the optical structure 308. Further, in some embodiments, instead of a trench isolation structure (104 of FIG. 1C), in some embodiments, the CMOS image sensor comprises a partial backside trench isolation structure 310. The partial backside trench isolation structure 310 may be formed during backside patterning manufacturing steps, and may comprise a doped semiconductor material (e.g., doped polysilicon) or a dielectric material (e.g., silicon dioxide). In some embodiments, the optical structure 308 may comprise, for example, anti-reflection layers and/or color filters. The microlens 306 may is configured to focus light to the overlying photodiode 302. During operation, incident light hits the backside 102b of the substrate 102 through the microlens 306 and optical structure 308, and the incident light travels to the photodiode 302. The photodiode 302 is configured to convert the incident light (e.g., photons) into an electrical signal (i.e., to generate electron-hole pairs from the incident light). When a voltage is applied to the gate electrode structure 108 to turn the vertical-gate transistor 101 "ON," accumulated charges in the photodiode 302 are transferred from the photodiode 302 to the FD node 304 to output an electrical signal (e.g., voltage, current) associated with the incident light. Thus, the image sensor in FIG. 3 converts incident light into an electrical signal for processing. Because the gate electrode structure 108 also comprises the first and second vertical portions (108b, 108c of FIG. 1A), the vertical-gate transistor 101, and thus, the image sensor is more reliable.

Figure 4:
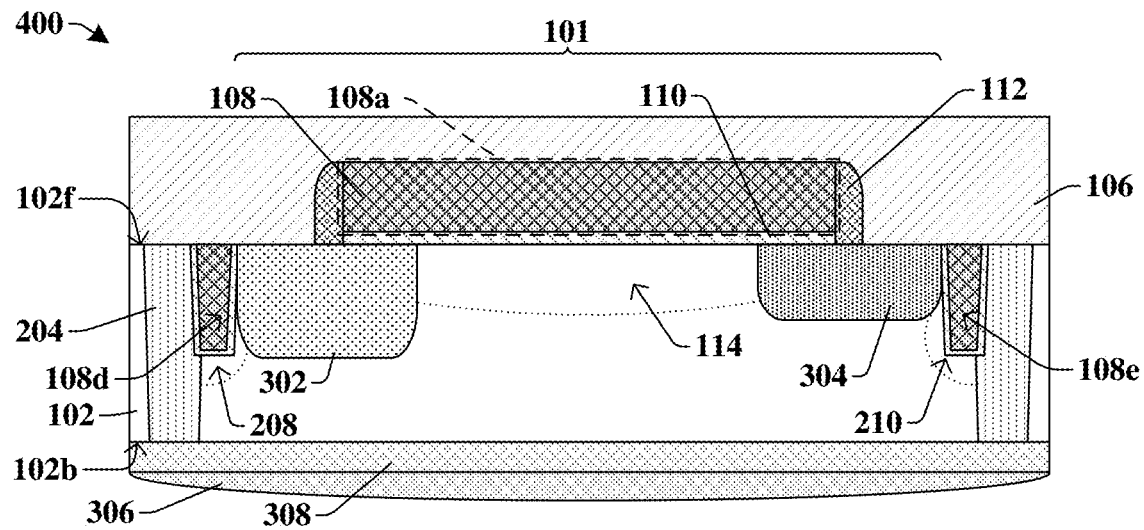
FIG. 4 illustrates a cross-sectional view of some embodiments of an image sensor having a gate electrode structure comprising a horizontal portion arranged over a vertical portion, wherein the vertical portion of the gate electrode structure is a continuously connected ring-like structure.

FIG. 4 illustrates a cross-sectional view 400 of some alternative embodiments of the integrated chip of FIG. 2C, wherein the integrated chip of the cross-sectional view 400 is a complementary metal-oxide-semiconductor (CMOS) image sensor. Thus, the cross-sectional view 400 of FIG. 4 may correspond to alternative embodiments corresponding to cross-section line CC' of FIG. 2B.

As illustrated in the cross-sectional view 400, in some embodiments, the gate electrode structure 108 may be or comprise a transfer gate electrode in an image sensor. In some embodiments, the third vertical portion 108d of the gate electrode structure 108 may be arranged between the heavily doped region 204 and a photodiode 302. Further, in some embodiments, the fourth vertical portion 108e of the gate electrode structure 108 may be arranged between the heavily doped region 204 and a FD node 304. The heavily doped region 204 may prevent leakage of accumulated charges traveling between the photodiode 302 and the FD node 304 through the channel region 114, the first additional channel region 208, and the second additional channel region 210 during operation of the vertical-gate transistor 101 of the image sensor.

Figure 5:
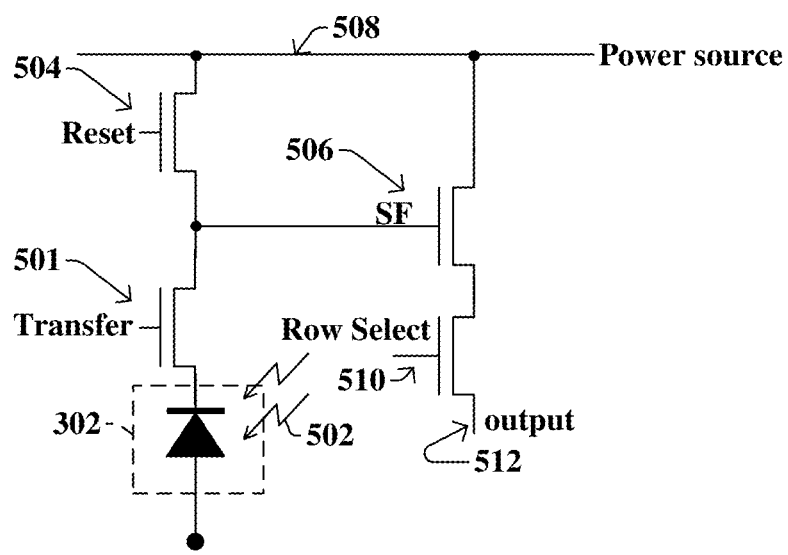
FIG. 5 illustrates a circuit diagram of some embodiments of an image sensor comprising four transistors.

FIG. 5 illustrates a circuit diagram 500 of some embodiments that includes an image sensor, such as the image sensor of FIG. 3 or 4.

As shown in FIG. 5, the circuit diagram 500 may include a photodiode 302 coupled to a transfer transistor 501. In some embodiments, the photodiode 302 acts as a source/drain region of the transfer transistor 501. In other embodiments, the photodiode 302 is coupled to a source/drain region of the transfer transistor 501. Thus, the transfer transistor 501 may be or comprise the vertical-gate transistors 101 of FIG. 3 or 4. The photodiode 302 accumulates charge (e.g., electrons) from incident light 502 on the photodiode 302. The transfer transistor 501 selectively transfers charge from the photodiode 302 to the image sensor. A reset transistor 504 is electrically connected between a power source 508 and the floating diffusion node (304 of FIG. 3) to selectively clear charge at the floating diffusion node (304 of FIG. 3). A source follower transistor 506 is electrically connected between the power source 508 and an output 512, and is gated by the floating diffusion node (304 of FIG. 3), to allow the charge at the floating diffusion node (304 of FIG. 3) to be observed without removing the charge. A row select transistor 510 is electrically connected between the source follower transistor 506 and the output 512 to selectively output a voltage proportional to the voltage at the floating diffusion node (304 of FIG. 3). Thus, the reset transistor 504, the source follower transistor 506, and/or the row select transistor 510 may comprise the vertical-gate transistors 101 of FIGS. 1A-1C or 2A-2C. It will be appreciated that other configurations of the circuit diagram 500 of FIG. 5 are within the scope of the disclosure.

FIGS. 6A-16C illustrate various views 600A-1600C of some embodiments of a method of forming a vertical-gate transistor having a gate electrode structure comprising a first vertical portion and a second vertical portion. Although FIGS. 6A-16C are described in relation to a method, it will be appreciated that the structures disclosed in FIGS. 6A-16C are not limited to such a method, but instead may stand alone as structures independent of the method.

Figure 6A:
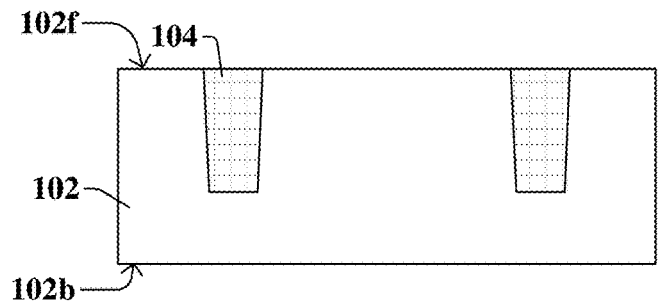
FIGS. 6A-16C illustrate various views of some embodiments of a method of forming an integrated chip having a gate electrode structure as illustrated in FIGS. 1A-1C.

As shown in cross-sectional view 600A of FIG. 6A, a substrate 102 is provided. The substrate 102 includes a frontside 102f and a backside 102b and may, for example, be a bulk monocrystalline silicon substrate, a semiconductor or insulator (SOI) substrate, or some other suitable semiconductor substrate (e.g., SiGe, Ge, etc.). In some embodiments, a trench isolation structure 104 is formed within the substrate and extends from the frontside 102f of the substrate 102 and towards the backside 102b of the substrate 102. In some embodiments, the trench isolation structure 104 may be or comprise a shallow trench isolation (STI) structure because the trench isolation structure 104 does not extend completely from the frontside 102f of the substrate 102 to the backside 102b of the substrate 102. In some embodiments, the trench isolation structure 104 extends into the frontside 102f of the substrate 102 to a depth of approximately 1500 angstroms, for example. It will be appreciated that other values are also within the scope of the disclosure.

In some embodiments, the trench isolation structure 104 may be formed by a selective ion implantation process. For example, in some embodiments, the trench isolation structure 104 has a higher doping concentration than the substrate 102 because of the ion implantation process. In some other embodiments, the trench isolation structure 104 may be formed by, for example, photolithography, removal, and/or deposition processes such that the trench isolation structure 104 comprises silicon dioxide or some other dielectric material.

It will be appreciated that other methods and structures are also within the scope of the disclosure. For example, in some other embodiments, the formation of a trench isolation structure 104 in FIGS. 6A-C is omitted, and a backside isolation structure is formed after patterning of the frontside 102f of the substrate 102 is complete.

Figure 6B:
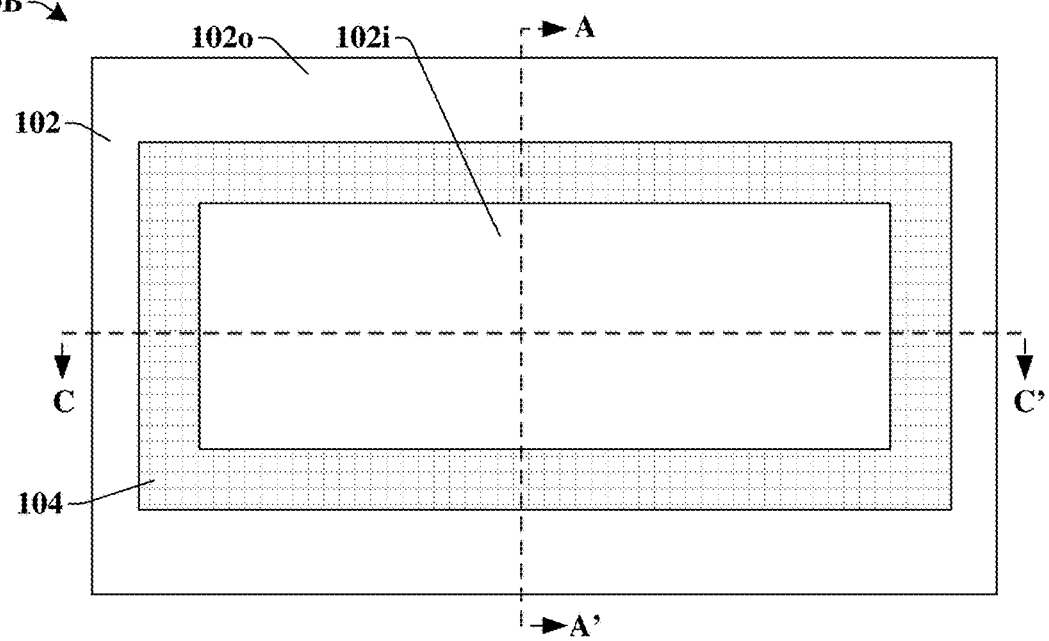

FIG. 6B illustrates a top-view 600B of some embodiments corresponding to the cross-sectional view 600A of FIG. 6A. In some embodiments, the cross-sectional view 600A corresponds to cross-section line AA' of FIG. 6B.

As shown in the top-view 600B, in some embodiments, the trench isolation structure 104 is a continuous ring-like structure. In such embodiments, the trench isolation structure 104 may separate an inner region 102i of the substrate 102 from an outer region 102o of the substrate 102. In some embodiments, the inner region 102i of the substrate 102 and the inner perimeter of the trench isolation structure 104 have an overall rectangular-like shape. In other embodiments, the inner region 102i of the substrate 102 and the inner perimeter of the trench isolation structure 104 comprise an overall circular-like, oval-like, or some other polygon-like shape.

Figure 6C:
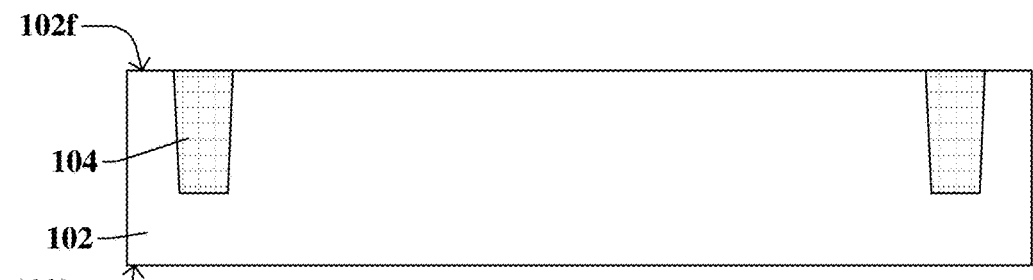

FIG. 6C illustrates a cross-sectional view 600C of some embodiments corresponding to cross-section line CC' of FIG. 6B.

Figure 7A:
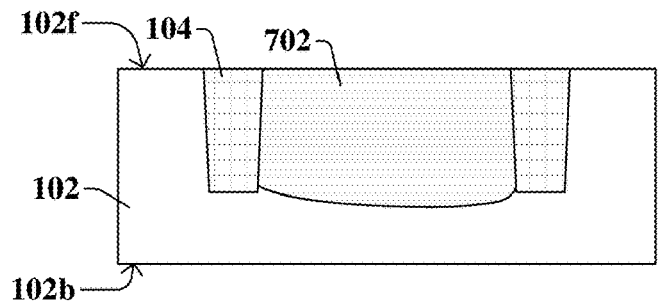
Figure 7B:
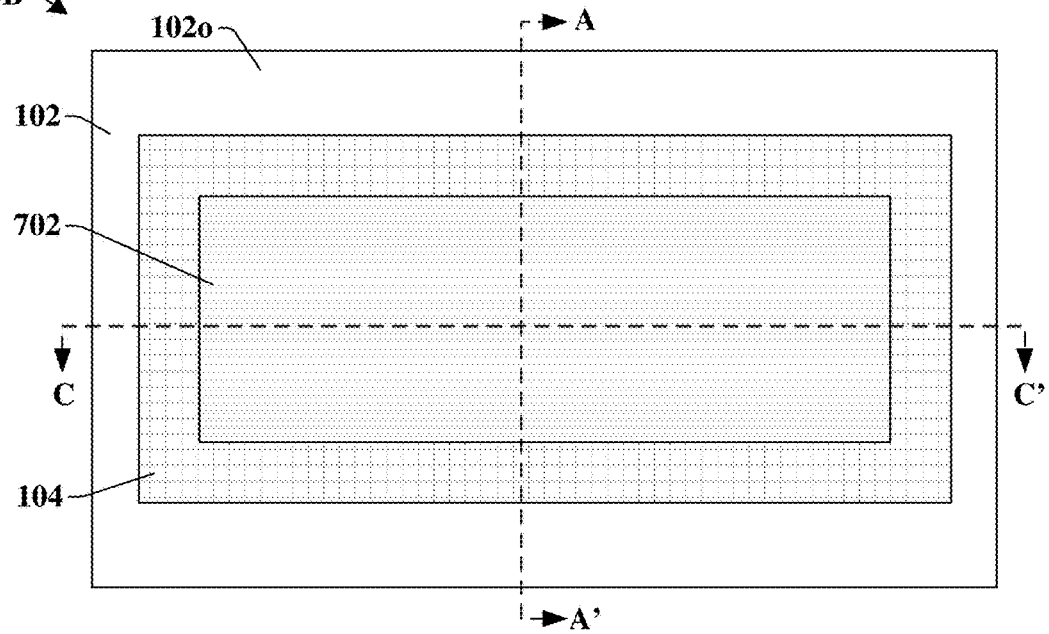

As shown in cross-sectional view 700A of FIG. 7A, in some embodiments, a doped well region 702 is formed between the trench isolation structure 104. In some embodiments, the substrate 102 has a first doping type (e.g., p-type or n-type), and the doped well region 702 is formed to increasing the concentration of the first doping type. The doped well region 702 may be formed using photolithography and ion implantation processes. In other embodiments, the substrate 102 comprises the first doping type, and the doping concentration of the first doping type in the substrate 102 is sufficient. In such other embodiments, formation of the doped well region 702 is omitted. It will be appreciated that other structures are also within the scope of the disclosure FIG. 7B illustrates a top-view 700B of some embodiments corresponding to the cross-sectional view 700A of FIG. 7A. In some embodiments, the cross-sectional view 700A corresponds to cross-section line AA' of FIG. 7B.

As illustrated in the top-view 700B of FIG. 7B, in some embodiments, the doped well region 702 is localized to the inner region (102i of FIG. 6B) of the substrate 102. In some embodiments, the trench isolation structure 104 continuously surrounds the doped well region 702. In some embodiments, the trench isolation structure 104 is doped to the same, first doping type as the doped well region 702. In such embodiments, the trench isolation structure 104 has a doping concentration that is higher than a doping concentration of the doped well region 702. In other embodiments, the trench isolation structure 104 may not be doped, and thus, the doped well region 702 may have a higher doping concentration than the trench isolation structure 104. In some embodiments, the doped well region 702 may directly contact the trench isolation structure 104, whereas in other embodiments, the doped well region 702 may be separated from the trench isolation structure 104 by the substrate 102.

Figure 7C:
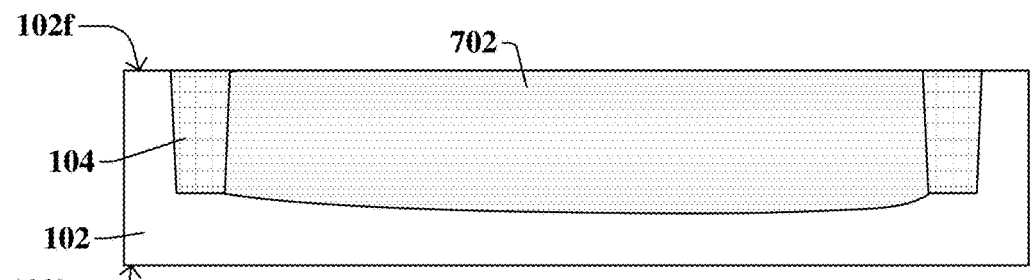

FIG. 7C illustrates a cross-sectional view 700C of some embodiments corresponding to cross-section line CC' of FIG. 7B.

Figure 8A:
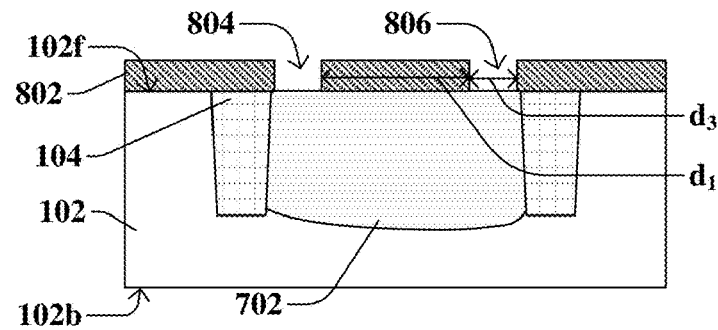

As shown in cross-sectional view 800A of FIG. 8A, in some embodiments, a first masking structure 802 is formed over the frontside 102f of the substrate 102. The first masking structure 802 may comprise a first opening 804 and a second opening 806. The first and second openings 804, 806 may be arranged within the inner region (102i of FIG. 6B) of the substrate 102 as defined by the trench isolation structure 104. In some embodiments, the first opening 804 of the first masking structure 802 directly overlies and exposes the doped well region 702, and the second opening 806 of the first masking structure 802 directly overlies and exposes the doped well region 702. In other embodiments, the first and second openings 804, 806 may directly overlie portions of the trench isolation structure 104 and the doped well region 702.

The first and second openings 804, 806 may each have a width equal to a third distance $d_3$. In some embodiments, the third distance $d_3$ is in a range of, for example, between approximately 10 nanometers and approximately 1 micrometer. The first opening 804 may be spaced apart by the second opening 806 by a first distance $d_1$. The first distance $d_1$, in some embodiments, may be in a range of between, for example, approximately 1 nanometer and approximately 1000 nanometers. It will be appreciated that other values are also within the scope of the disclosure.

In some embodiments, the first masking structure 802 is formed through photolithography and removal (e.g., etching) processes. In some embodiments, the first masking structure 802 comprises a photoresist material, whereas in other embodiments, the first masking structure 802 comprises a hard mask material, for example.

Figure 8B:
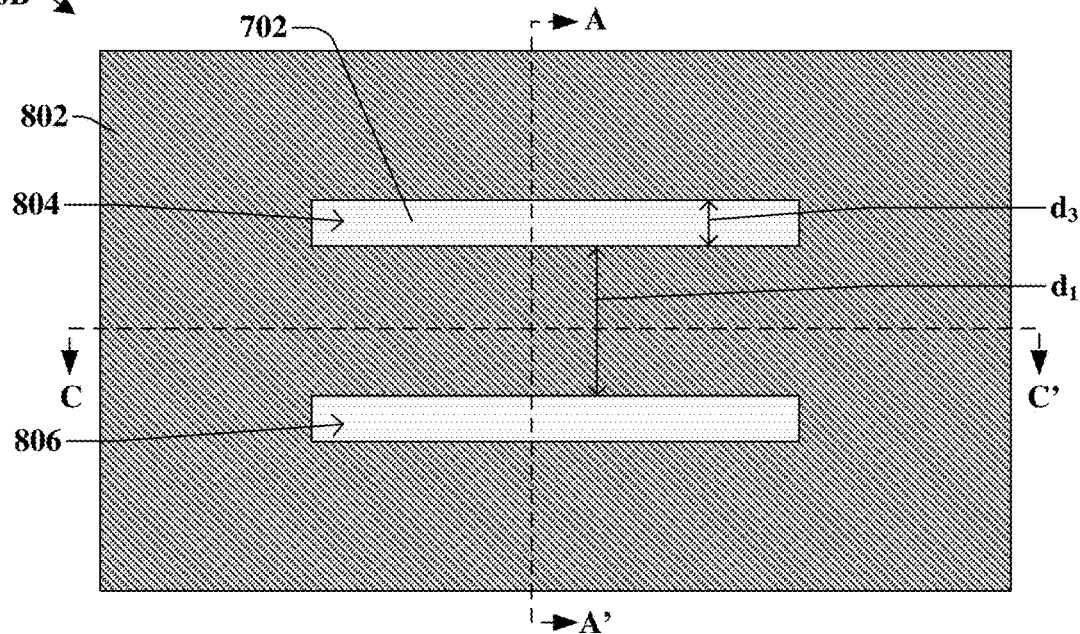

FIG. 8B illustrates a top-view 800B of some embodiments corresponding to the cross-sectional view 800A of FIG. 8A. In some embodiments, the cross-sectional view 800A corresponds to cross-section line AA' of FIG. 8B.

As shown in the top-view 800B, in some embodiments, the first opening 804 extends in a first direction to expose portions of the doped well region 702. Further, in some embodiments, the second opening 806 also extends in the first direction to expose portions of the doped well region 702. In some embodiments, the first opening 804 is not connected to the second opening 806. In such embodiments, the first opening 804 may be spaced apart from the second opening 806 by portions of the first masking structure 802 and by the first distance $d_1$. In some embodiments, the first and second openings 804, 806 may be substantially parallel to one another.

Figure 8C:
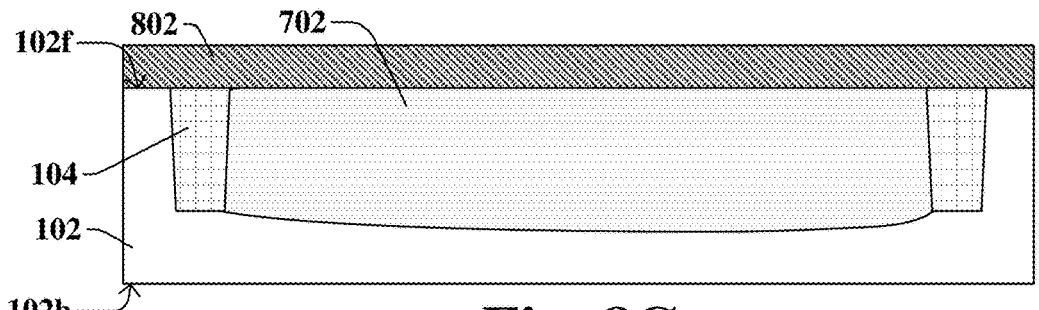

FIG. 8C illustrates a cross-sectional view 800C of some embodiments corresponding to cross-section line CC' of FIG. 8B. In some embodiments, the first and/or second openings (804, 806 of FIG. 8A) are not visible from the perspective of the cross-sectional view 800C.

Figure 9A:
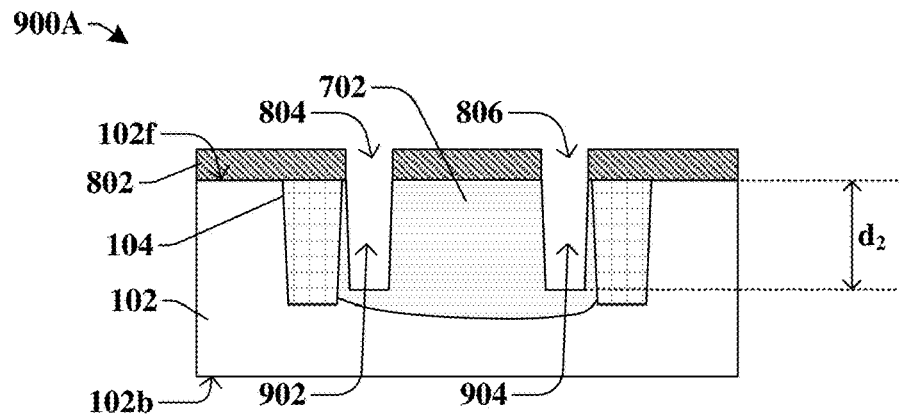

As shown in cross-sectional view 900A of FIG. 9A, in some embodiments, a first removal process is performed to remove portions of the doped well region 702. After the first removal process is performed, a first trench structure 902 and a second trench structure 904 are formed according to the first opening 804 and the second opening 806, respectively, of the first masking structure 802. In some embodiments, the first removal process comprises a dry etchant. In some embodiments, the dry etchant is a substantially vertical etchant to remove portions of the doped well region 702 in a second direction. The second direction may be substantially perpendicular to the first direction.

In some embodiments, the first and second trench structures 902, 904 are formed to a depth equal to a second distance $d_2$. The second distance $d_2$ is measured from the frontside 102f of the substrate 102. In some embodiments, the second distance $d_2$ may be in a range of between, for example, approximately 1 nanometer and approximately 1 micrometer. In some embodiments comprising the doped well region 702, the first and second trench structures 902, 904 may be defined by inner surfaces of the doped well region 702. Thus, in some embodiments, bottom surfaces of the first and second trench structures 902, 904 do not extend below the doped well region 702. Further, in some embodiments, due to the substantially vertical etchant, the first and second trench structures 902, 904 may have slanted (i.e., not normal to the backside 102b of the substrate 102) sidewalls.

It will be appreciated that other structures and processing steps are also within the scope of the disclosure.

Figure 9B:
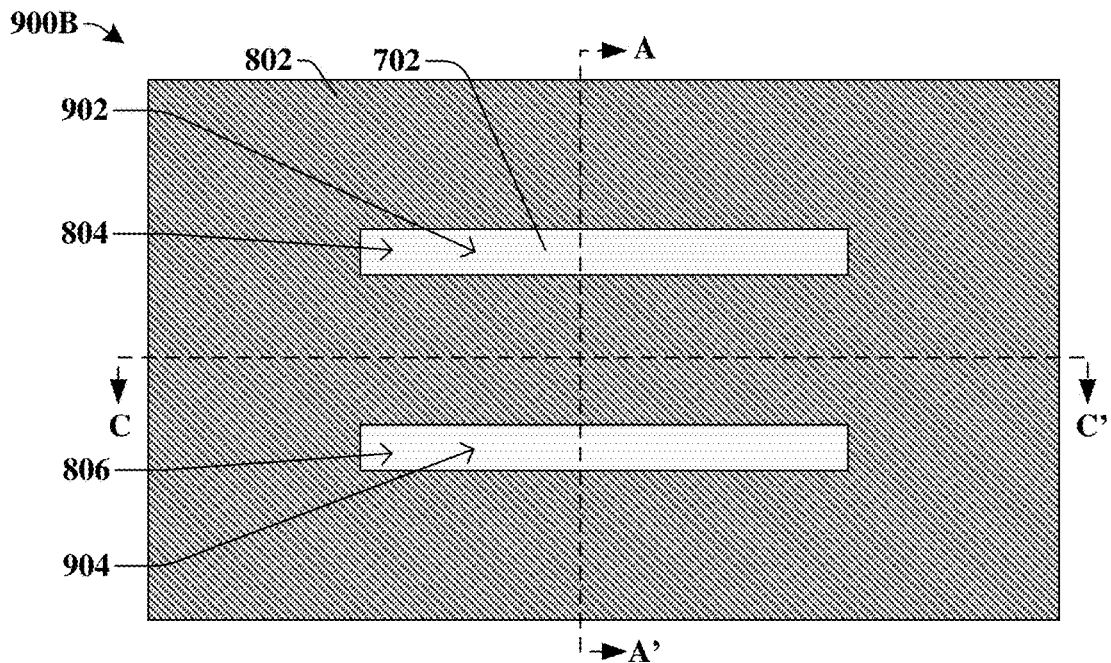

FIG. 9B illustrates a top-view 900B of some embodiments corresponding to the cross-sectional view 900A of FIG. 9A. In some embodiments, the cross-sectional view 900A corresponds to cross-section line AA' of FIG. 9B.

In some embodiments, the top-view 900B appears to comprise the same features as the top-view 800B of FIG. 8B. However, it will be appreciated that the first and second trench structures 902, 904 are present directly below the first and second openings 804, 806, respectively, of the first masking structure 802.

Figure 9C:
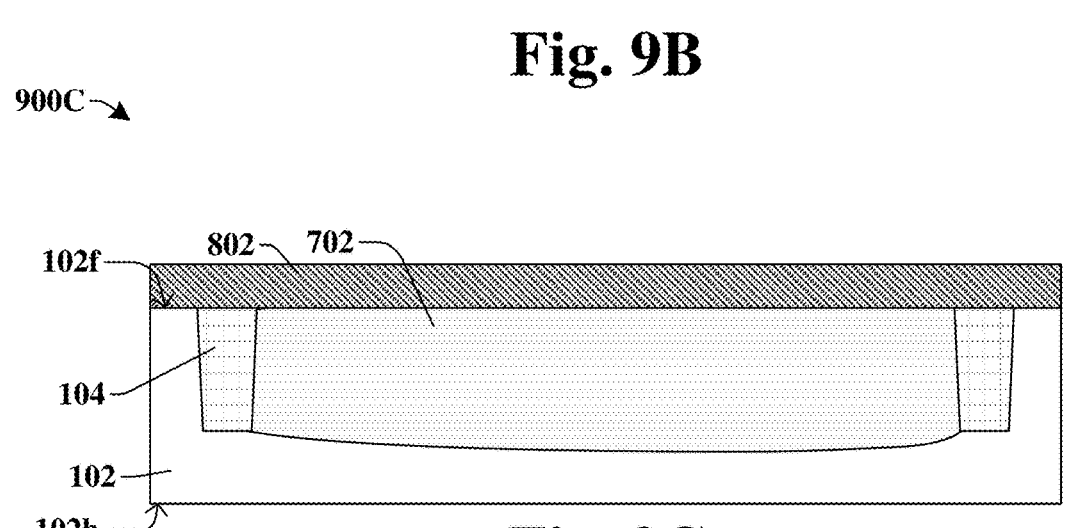

FIG. 9C illustrates a cross-sectional view 900C of some embodiments corresponding to cross-section line CC' of FIG. 9B. In some embodiments, the first and/or second openings (804, 806 of FIG. 9A) and thus, the first and/or second trench structures (902, 904 of FIG. 9A) are not visible from the perspective of the cross-sectional view 900C.

Figure 10A:
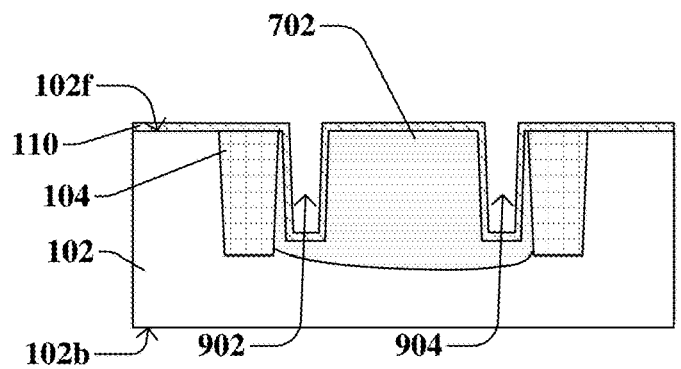

As shown in cross-sectional view 1000A of FIG. 10A, in some embodiments, a gate dielectric layer 110 is formed over the frontside 102f of the substrate 102. In some embodiments, the gate dielectric layer 110 is formed by way of a deposition process (e.g., chemical vapor deposition (CVD), physical vapor deposition (PVD), atomic layer deposition (ALD), etc.). In some embodiments, for example, the gate dielectric layer 110 may comprise silicon dioxide or a low-k dielectric material. In such embodiments, the gate dielectric layer 110 may be deposited by a thermal oxidation process. The gate dielectric layer 110 may cover inner surfaces of the first and second trench structures 902, 904, but does not completely fill the first and second trench structures 902, 904.

Figure 10B:
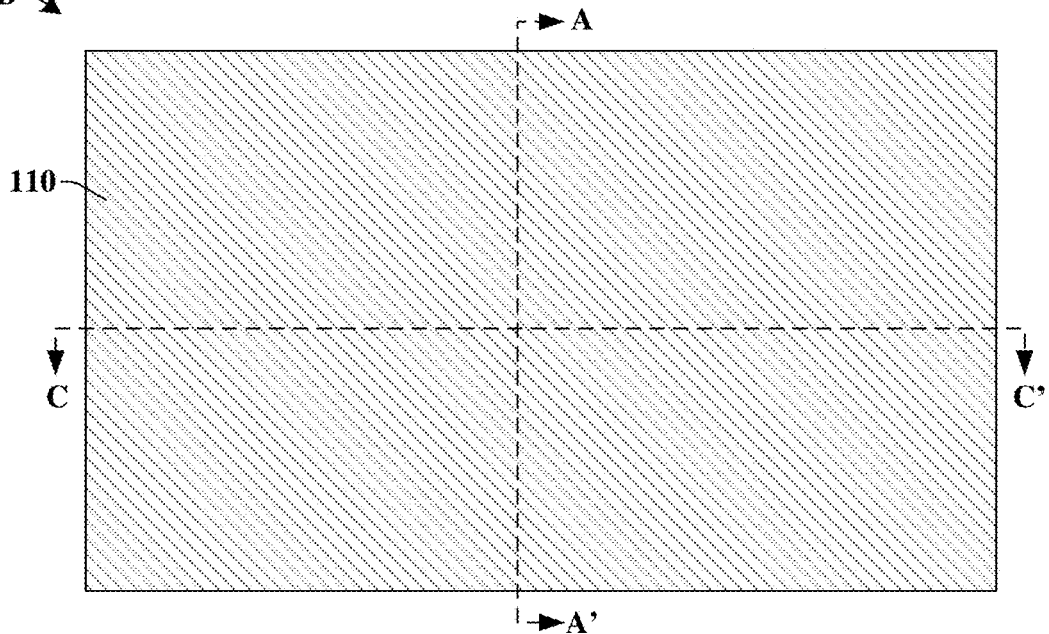

FIG. 10B illustrates a top-view 1000B of some embodiments corresponding to the cross-sectional view 1000A of FIG. 10A. In some embodiments, the cross-sectional view 1000A corresponds to cross-section line AA' of FIG. 10B. As shown in the top-view 1000B, in some embodiments, the gate dielectric layer 110 completely covers the frontside (102f of FIG. 10A) of the substrate (102 of FIG. 10A).

Figure 10C:
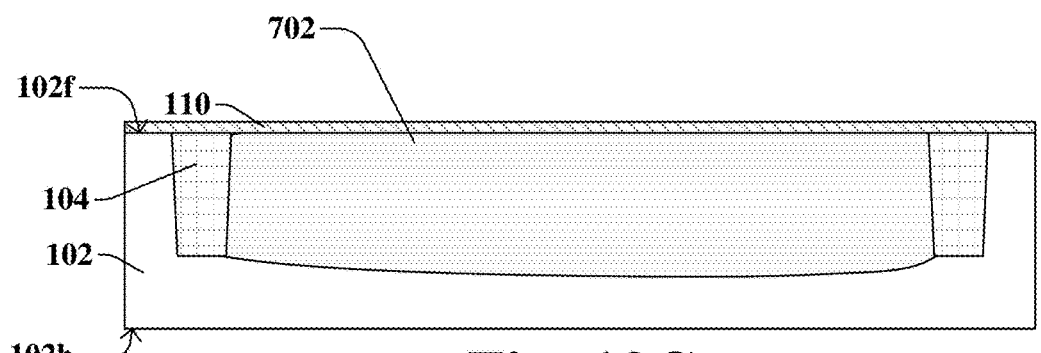

FIG. 10C illustrates a cross-sectional view 1000C of some embodiments corresponding to cross-section line CC' of FIG. 10B.

Figure 11A:
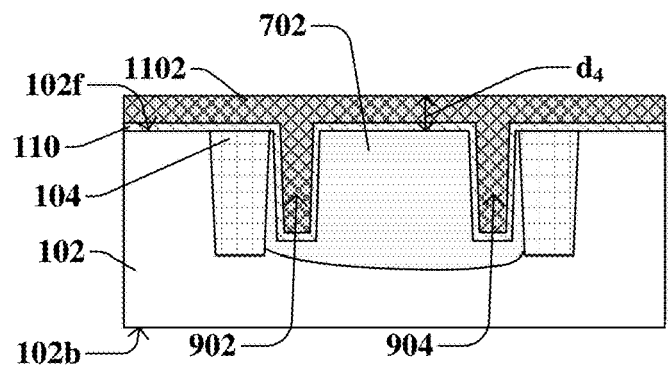

As shown in cross-sectional view 1100A of FIG. 11A, in some embodiments, a gate material 1102 is formed over the frontside 102f of the substrate 102 on the gate dielectric layer 110 and within the first and second trench structures 902, 904. In some embodiments, the gate material 1102 comprises a conductive material such as polysilicon. In such embodiments, the polysilicon may be doped. In such embodiments, the gate material 1102 may be grown on the gate dielectric layer 110 in a furnace and/or epi chamber. In other embodiments, the gate material 1102 may comprise a conductive metal such as, for example, copper, tungsten, aluminum or others. In such other embodiments, the gate material 1102 may be formed by way of a deposition process (e.g., CVD, PVD, ALD, sputtering, etc.). It will be appreciated that other materials are also within the scope of the disclosure.

In some embodiments, the gate material 1102 may have a height equal to a fourth distance $d_4$ measured from the frontside 102f of the substrate to a top surface of the gate material 1102. In some embodiments, the fourth distance $d_4$ is in a range of between, for example, approximately 20 nanometers and approximately 400 nanometers.

Figure 11B:
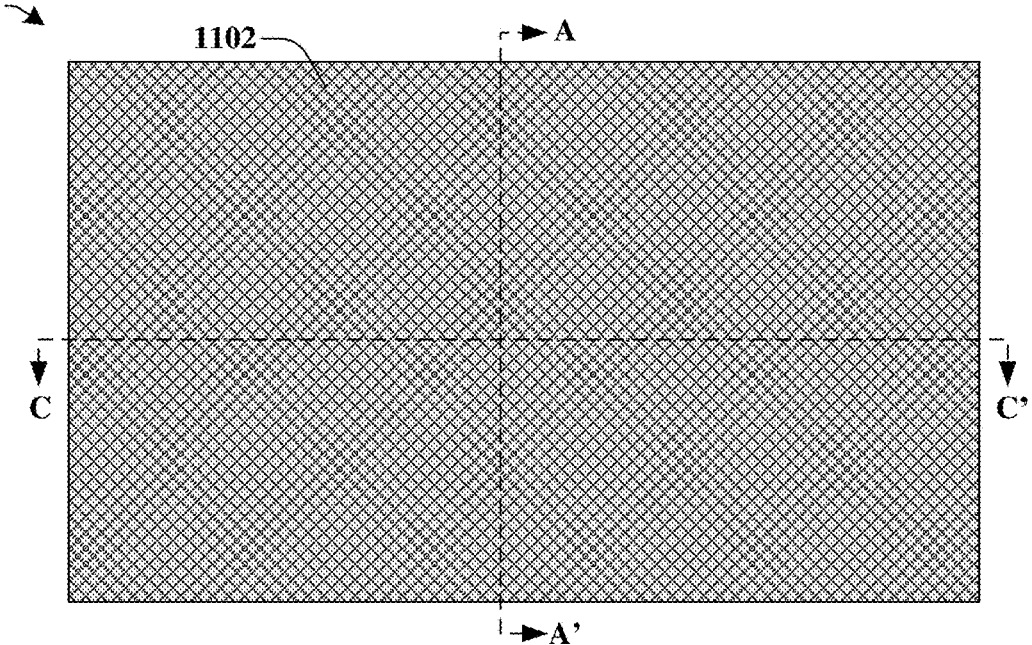

FIG. 11B illustrates a top-view 1100B of some embodiments corresponding to the cross-sectional view 1100A of FIG. 11A. In some embodiments, the cross-sectional view 1100A corresponds to cross-section line AA' of FIG. 11B. As shown in the top-view 1100B, in some embodiments, the gate material 1102 completely covers the frontside (102f of FIG. 10A) of the substrate (102 of FIG. 10A).

Figure 11C:
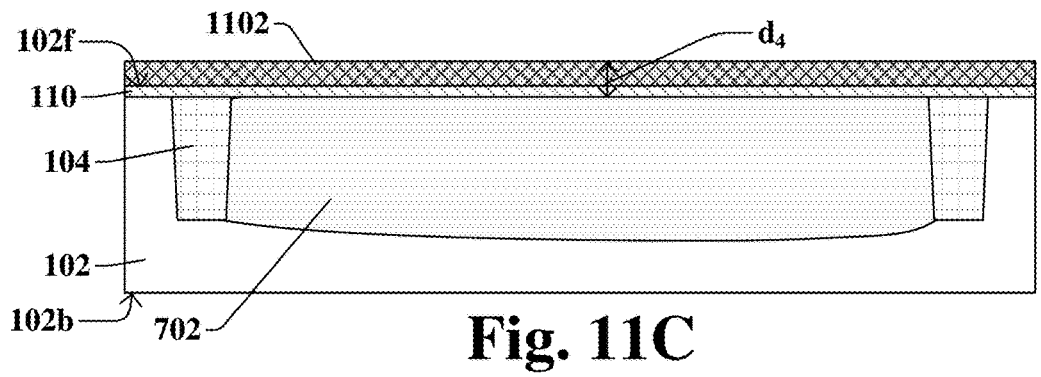

FIG. 11C illustrates a cross-sectional view 1100C of some embodiments corresponding to cross-section line CC' of FIG. 11B. As shown in the cross-sectional view 1100C, from some perspectives, the gate material 1102 does not extend below the frontside 102f of the substrate 102.

Figure 12A:
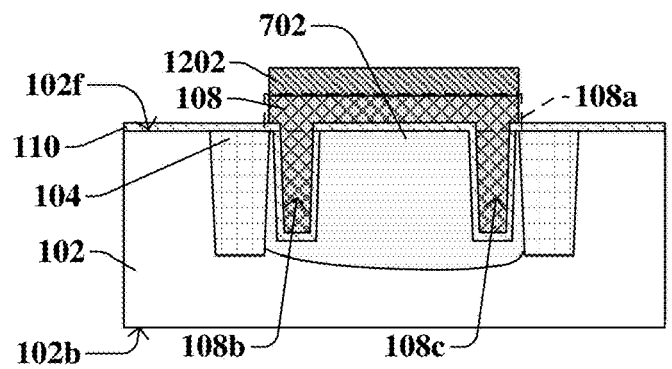

As shown in cross-sectional view 1200A of FIG. 12A, in some embodiments, a second masking structure 1202 is formed over the gate material (1102 of FIG. 11A), and a second removal process is performed to remove outer portions of the gate material (1102 of FIG. 11A) and to form a gate electrode structure 108. In some embodiments, the second masking structure 1202 is formed by way of photolithography and removal processes. The second masking structure 1202 may comprise a photoresist material or a hard mask material, for example. Further, in some embodiments, the second removal process may comprise an etching process that uses a dry etchant, for example.

In some embodiments, after the second removal process, the gate electrode structure 108 does not cover or does not completely cover the trench isolation structure 104. In some embodiments, the second removal process also removes the gate dielectric layer 110 that does not directly underlie the second masking structure 1202. In other embodiments, the second removal process does remove the gate dielectric layer 110 that does not directly underlie the second masking structure 1202. In some embodiments, as shown in the cross-sectional view 1200A, the gate electrode structure 108 may comprise a horizontal portion 108a arranged over the frontside 102f of the substrate 102; a first vertical portion 108b protruding from the horizontal portion 108a and extending towards the backside 102b of the substrate 102; and a second vertical portion 108c protruding from the horizontal portion 108a and extending towards the backside 102b of the substrate 102. In some embodiments, the first and second vertical portions 108b, 108c are both within the doped well region 702 and both arranged within the inner region (102i of FIG. 6A) of the substrate 102. Thus, the trench isolation structure 104 surrounds both the first and second vertical portions 108b, 108c of the gate electrode structure 108. The first and second vertical portions 108b, 108c of the gate electrode structure 108 may increase the controllability of a channel region of the final device arranged below the gate electrode structure 108.

Figure 12B:
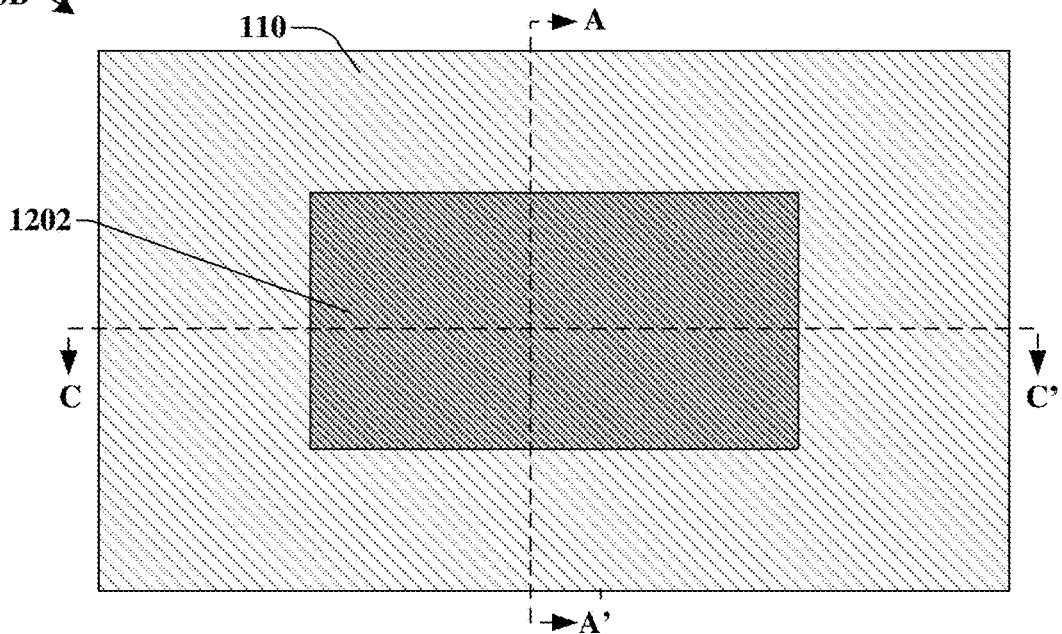

FIG. 12B illustrates a top-view 1200B of some embodiments corresponding to the cross-sectional view 1200A of FIG. 12A. In some embodiments, the cross-sectional view 1200A corresponds to cross-section line AA' of FIG. 12B. In some embodiments, the second masking structure 1202 completely covers the first and second vertical portions (108b, 108c of FIG. 12A) of the gate electrode structure (108 of FIG. 12A).

Figure 12C:
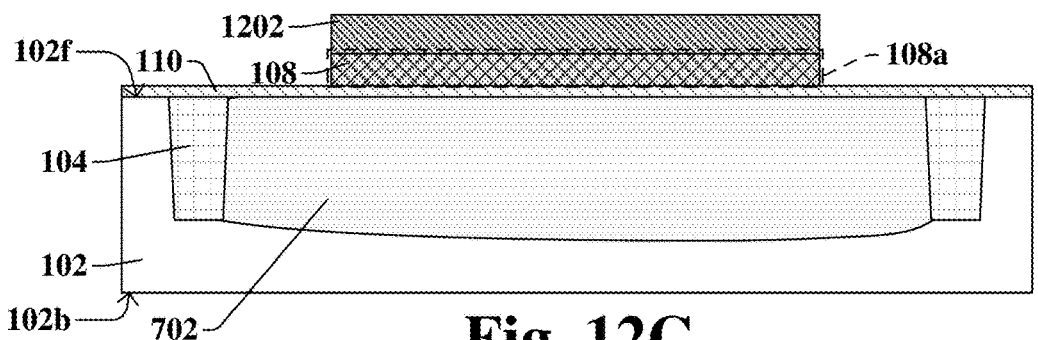

FIG. 12C illustrates a cross-sectional view 1200C of some embodiments corresponding to cross-section line CC' of FIG. 12B. As shown in the cross-sectional view 1200C, in some embodiments, the horizontal portion 108a of the gate electrode structure 108 is visible, whereas the first and second vertical portions (108b, 108c of FIG. 12A) are not visible.

Figure 13A:
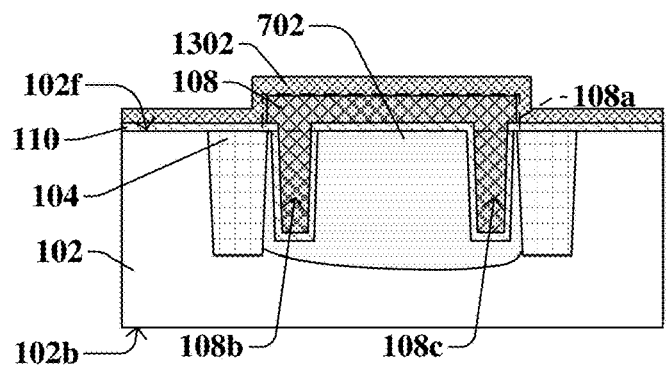

As shown in cross-sectional view 1300A of FIG. 13A, in some embodiments, a spacer layer 1302 is formed over the gate electrode structure 108 and over the frontside 102f of the substrate 102. In some embodiments, the spacer layer 1302 comprises a dielectric material such as, for example, a nitride (e.g., silicon nitride, silicon oxynitride), a carbide (e.g., silicon carbide), an oxide (e.g., silicon oxide), borosilicate glass (BSG), phosphoric silicate glass (PSG), borophosphosilicate glass (BPSG), a low-k oxide (e.g., a carbon doped oxide, SiCOH), or the like. In some embodiments, the gate dielectric layer 110 may separate the spacer layer 1302 from the substrate 102. In other embodiments, the spacer layer 1302 may directly contact the substrate 102. In some embodiments, the spacer layer 1302 may be formed by way of a deposition process (e.g., CVD, PVD, ALD, etc.).

Figure 13B:
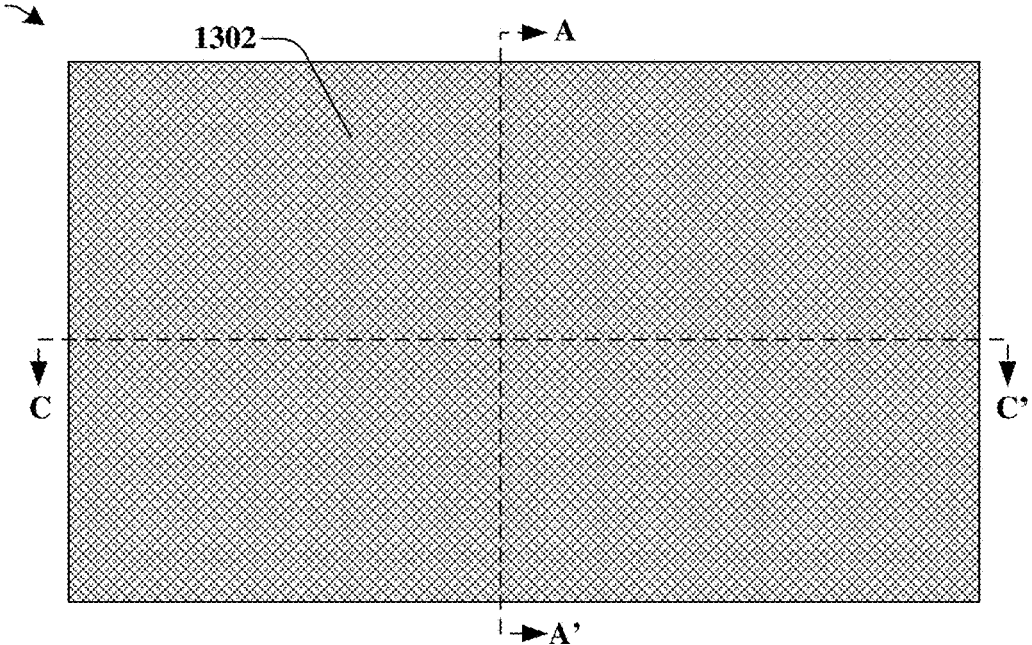

FIG. 13B illustrates a top-view 1300B of some embodiments corresponding to the cross-sectional view 1300A of FIG. 13A. In some embodiments, the cross-sectional view 1300A corresponds to cross-section line AA' of FIG. 13B. As shown in the top-view 1300B, in some embodiments, the spacer layer 1302 completely covers the substrate 102. In other embodiments, the spacer layer 1302 may be selectively deposited over an area of the substrate 102 by way of photolithography, removal, and/or deposition processes, for example.

Figure 13C:
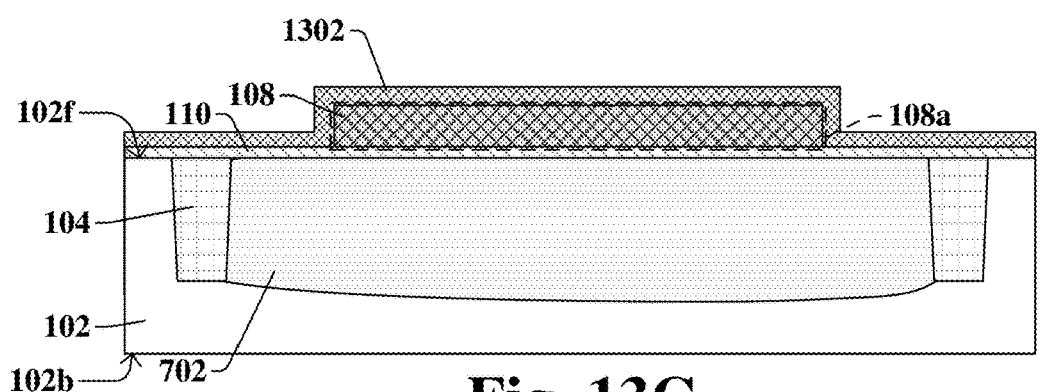

FIG. 13C illustrates a cross-sectional view 1300C of some embodiments corresponding to cross-section line CC' of FIG. 13B.

Figure 14A:
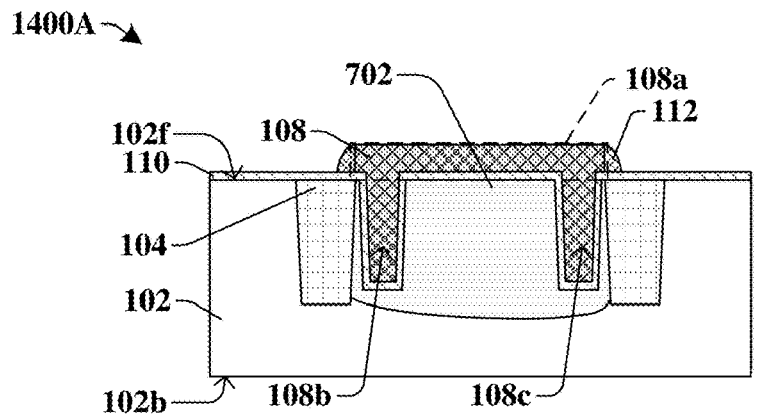

As illustrated in cross-sectional view 1400A of FIG. 14A, in some embodiments, a third removal process is performed to remove portions of the spacer layer (1302 of FIG. 13A) to form a sidewall spacer structure 112 on outer sidewalls the horizontal portion 108a of the gate electrode structure 108. The sidewall spacer structure 112 may protect the gate electrode structure 108 from damage from future processing steps, in some embodiments. In some embodiments, the third removal process does not remove exposed portions of the gate dielectric layer 110, as illustrated in the cross-sectional view 1400A. In other embodiments, exposed portions of the gate dielectric layer 110 may be removed by the third removal process. In some embodiments, the sidewall spacer structure 112 directly overlies the gate dielectric layer 110. In other embodiments, the sidewall spacer structure 112 may directly contact the frontside 102f of the substrate 102 or the trench isolation structure 104. The third removal process may be or comprise a vertical etching process, in some embodiments. It will be appreciated that other processes for forming the sidewall spacer structure 112 are also within the scope of the disclosure.

Figure 14B:
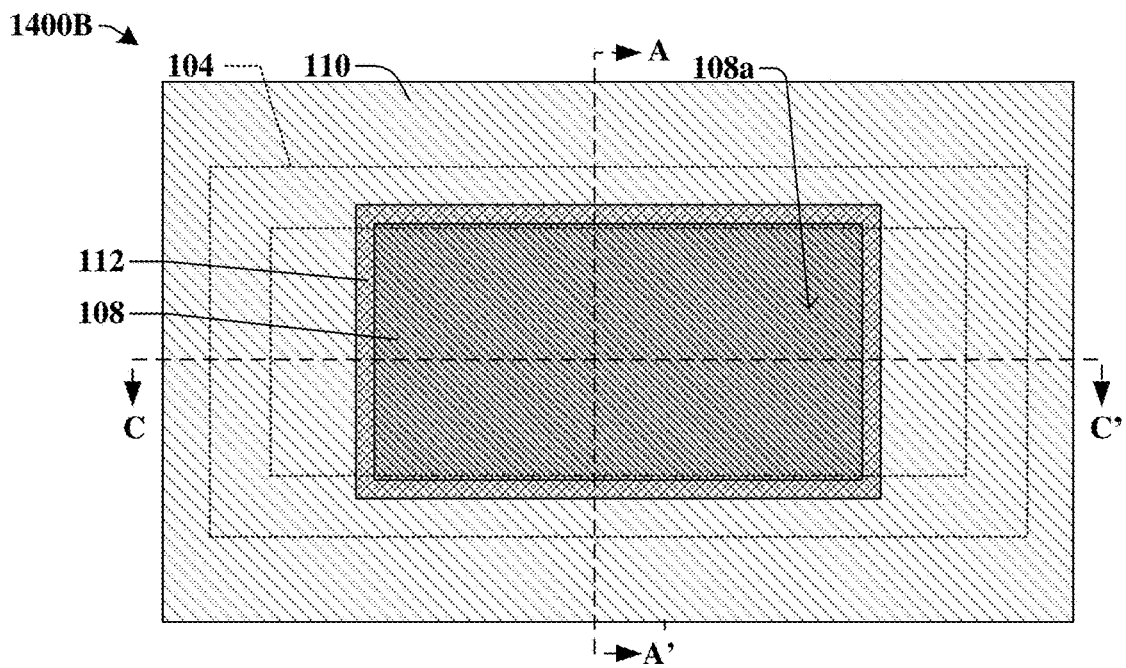

FIG. 14B illustrates a top-view 1400B of some embodiments corresponding to the cross-sectional view 1400A of FIG. 14A. In some embodiments, the cross-sectional view 1400A corresponds to cross-section line AA' of FIG. 14B. As shown in the top-view 1400B, in some embodiments, the sidewall spacer structure 112 continuously surrounds an outer perimeters of the horizontal portion 108a of the gate electrode structure 108. In some embodiments, the sidewall spacer structure 112 and/or the horizontal portion 108a of the gate electrode structure 108 may partially overlap the trench isolation structure 104. The trench isolation structure 104 may underlie the gate dielectric layer 110 in some embodiments, and thus, the trench isolation structure 104 is shown with dotted lines in the top-view 1400B of FIG. 14 for convenience.

Figure 14C:
Figure 14C:
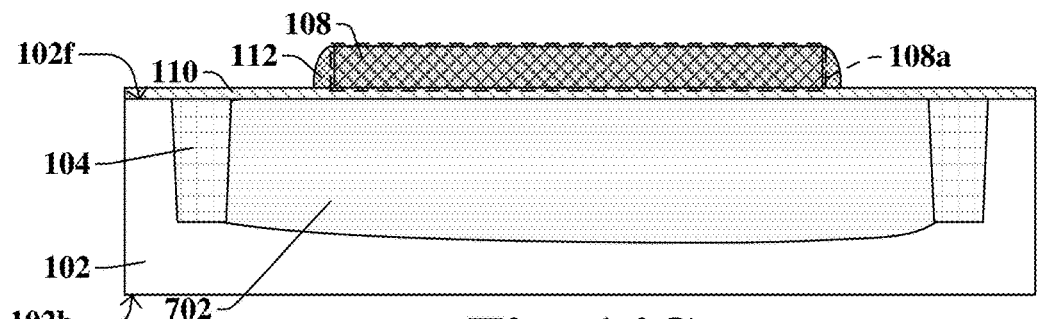

FIG. 14C illustrates a cross-sectional view 1400C of some embodiments corresponding to cross-section line CC' of FIG. 14B.

Figure 15A:
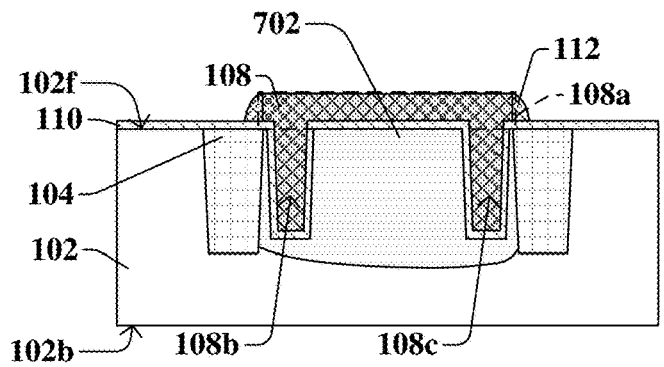
Figure 15B:
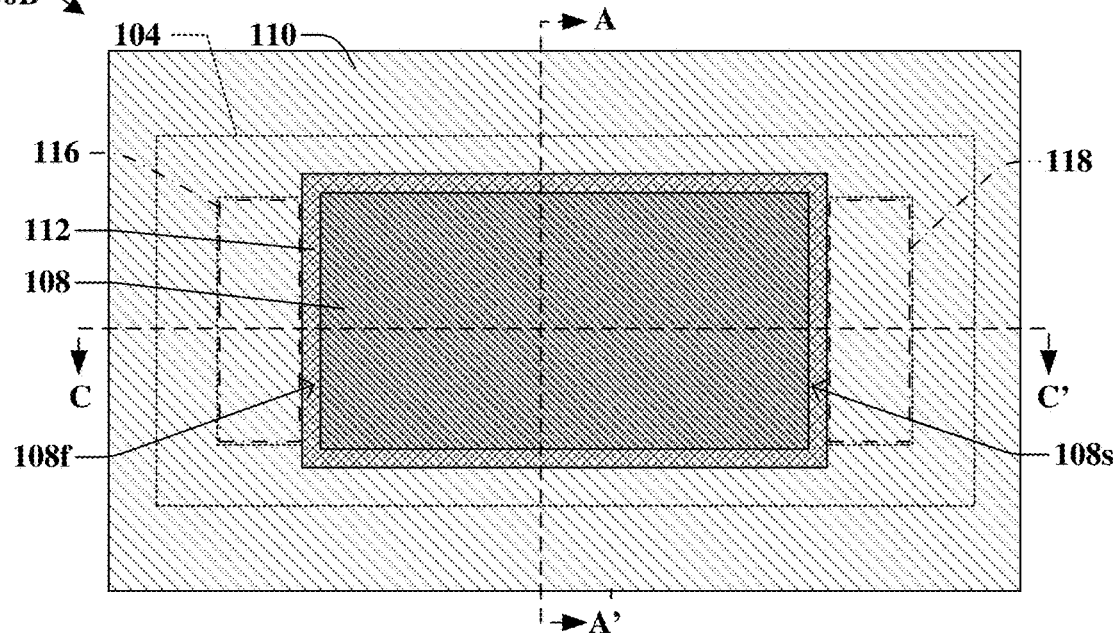
Figure 15C:
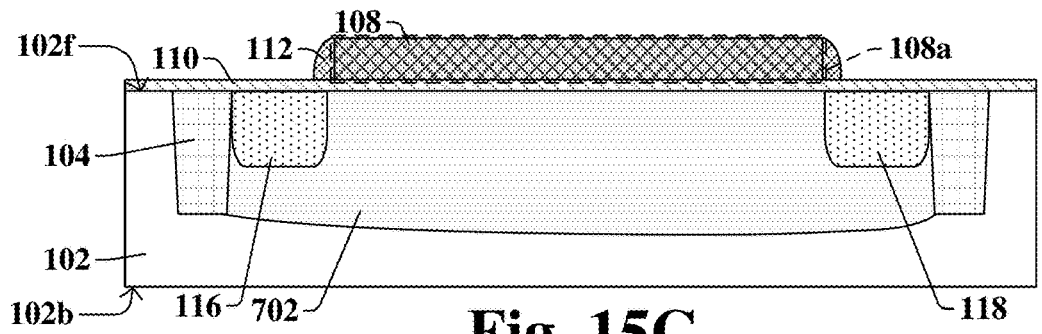

FIGS. 15A-15C illustrate various views 1500A-1500C, respectively, of a method of forming a first and second source/drain regions on the frontside of the substrate.

In some embodiments, FIG. 15A illustrates cross-sectional view 1500A after formation of first and second source/drain regions. However, from the perspective of the cross-sectional view 1500A, the first and second source/drain regions are not visible.

As shown in top-view 1500B of FIG. 15B, in some embodiments, a first source/drain region 116 on a first side 108f of the gate electrode structure 108, and a second source/drain region 118 is arranged on a second side 108s of the gate electrode structure 108. The first and second source/drain regions 116, 118 may be formed within the inner region (102i of FIG. 7B) of the substrate 102 as defined by the trench isolation structure 104. Because the first and second source/drain regions 116, 118 are arranged below the gate dielectric layer 110, the first and second source/drain regions 116, 118 are illustrated with dash-dotted lines in the top-view 1500B of FIG. 15B.

As shown in cross-sectional view 1500C of FIG. 15C, in some embodiments, the first and second source/drain regions 116, 118 are arranged within the substrate 102, and extend from the frontside 102f of the substrate 102 and towards the backside 102b of the substrate 102. In some embodiments, bottom surfaces of the first and second source/drain regions 116, 118 are arranged above a bottom surface of the trench isolation structure 104, such that the trench isolation structure 104 can effectively prevent current leakage from the first and/or second source/drain regions 116, 118. In some embodiments, the first and second source/drain regions 116, 118 are formed by way of an ion implantation process such that the first and second source/drain regions 116, 118 comprise a second doping type that is opposite to the first doping type of the doped well region 702. A masking layer may be used to protect other features (e.g., gate electrode structure 108, substrate 102, trench isolation structure 104, etc.) from being doped by the ion implantation process. In some embodiments, the gate dielectric layer 110 may remain over the substrate 102 during the ion implantation process to form the first and second source/drain regions 116, 118. In other embodiments, at least the gate dielectric layer 110 arranged over the first and second source/drain regions 116, 118 is removed prior to the ion implantation process. In some embodiments, the first and/or second source/drain regions 116, 118 partially underlie the gate electrode structure 108.

In some other embodiments, it will be appreciated that the first and/or second source/drain regions 116, 118 may be formed within the substrate 102 in prior steps. For example, in some embodiments, the image sensor illustrated in the cross-sectional view 300 of FIG. 3, the photodiode (302 of FIG. 3) and the floating diffusion node (304 of FIG. 3) may be formed prior to the formation of the gate electrode structure 108. In yet other embodiments, the photodiode (302 of FIG. 3) and the floating diffusion node (304 of FIG. 3) may be formed after the formation of the gate electrode structure 108.

Figure 16A:
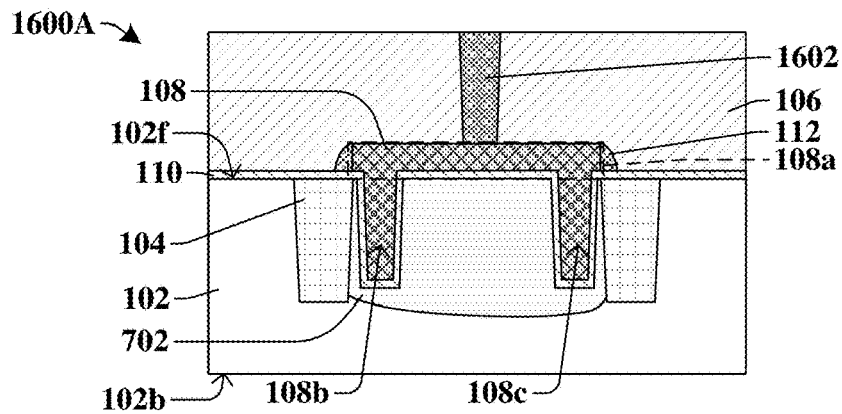

As shown in cross-sectional view 1600A of FIG. 16A, in some embodiments, a dielectric structure 106 is formed over the frontside 102f of the substrate 102, and a contact via 1602 is formed within the dielectric structure 106 to contact the gate electrode structure 108. In some embodiments, the gate dielectric layer 110 may comprise, for example, a nitride (e.g., silicon nitride, silicon oxynitride), a carbide (e.g., silicon carbide), an oxide (e.g., silicon oxide), borosilicate glass (BSG), phosphoric silicate glass (PSG), borophosphosilicate glass (BPSG), a low-k oxide (e.g., a carbon doped oxide, SiCOH), or the like. Further, the contact via 1602 may comprise, for example, tungsten, copper, aluminum, or some other conductive material. The dielectric structure 106 and the contact via 1602 may be formed by various cycles of deposition (e.g., CVD, PVD, ALD, sputtering, etc.), photolithography, and/or removal (e.g., etching, chemical mechanical planarization (CMP), etc.) processes.

Figure 16B:
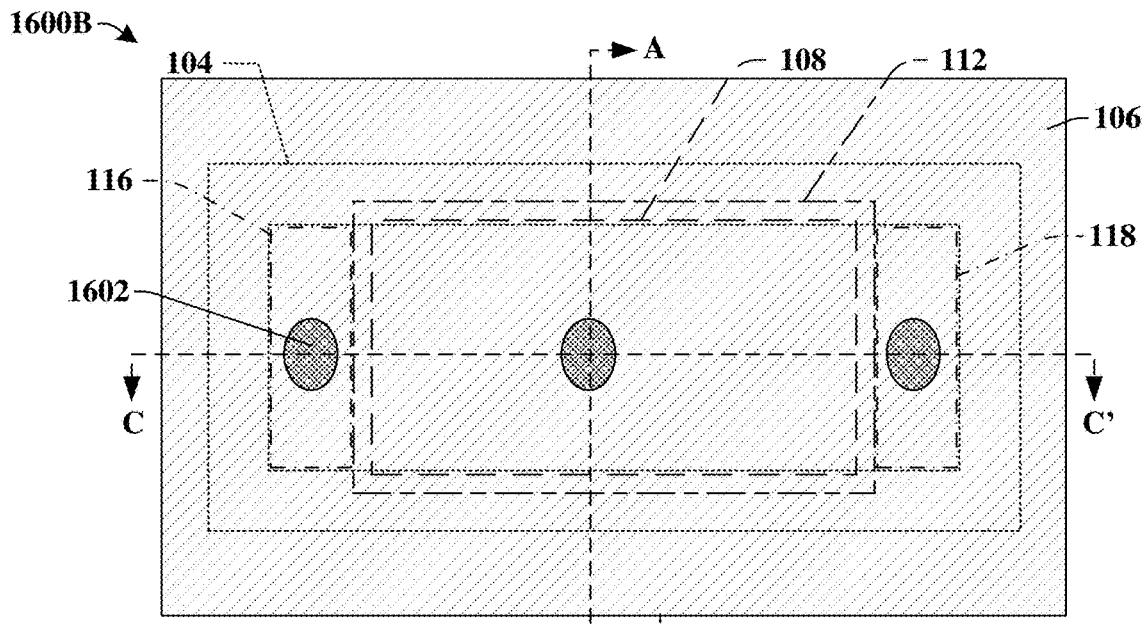

FIG. 16B illustrates a top-view 1600B of some embodiments corresponding to the cross-sectional view 1600A of FIG. 16A. In some embodiments, the cross-sectional view 1600A corresponds to cross-section line AA' of FIG. 16B.

As illustrated in the top-view 1600B, contact vias 1602 may also be arranged over the first and second source/drain regions 116, 118 and disposed in the dielectric structure 106. From the top-view 1600B, in some embodiments, the contact vias 1602 have an overall circular-like shape. In other embodiments, it will be appreciated that the contact vias 1602 may exhibit other shapes such as, for example, a square-like shape, a rectangular-like shape, an oval-like shape, or the like.

Figure 16C:
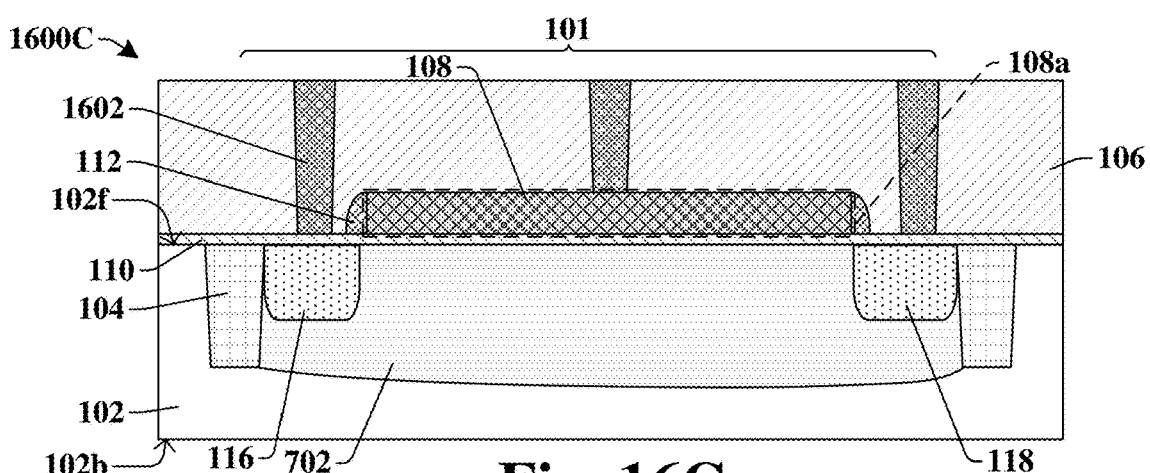

FIG. 16C illustrates a cross-sectional view 1600C of some embodiments corresponding to cross-section line CC' of FIG. 16B.

As illustrated in the cross-sectional view 1600C, contact vias 1602 contact the first source/drain region 116 and the second source/drain region 118. The contact via 1602 contacting the first source/drain region 116 may be coupled to a source terminal; the contact via 1602 contacting the gate electrode structure 108 may be coupled to a gate terminal; and the contact via 1602 coupled to the second source/drain region may be coupled to a drain terminal. Further, the first and second source/drain regions 116, 118 and the gate electrode structure 108 may be a part of a vertical-gate transistor 101 comprising the first and second vertical portions (108b, 108c of FIG. 16A) of the gate electrode structure 108. Because of the first and second vertical portions (108b, 108c of FIG. 16A), the vertical-gate transistor 101 has lower noise and higher controllability than in transistors where the gate electrode structure 108 only comprises the horizontal portion 108a.

Figure 17:
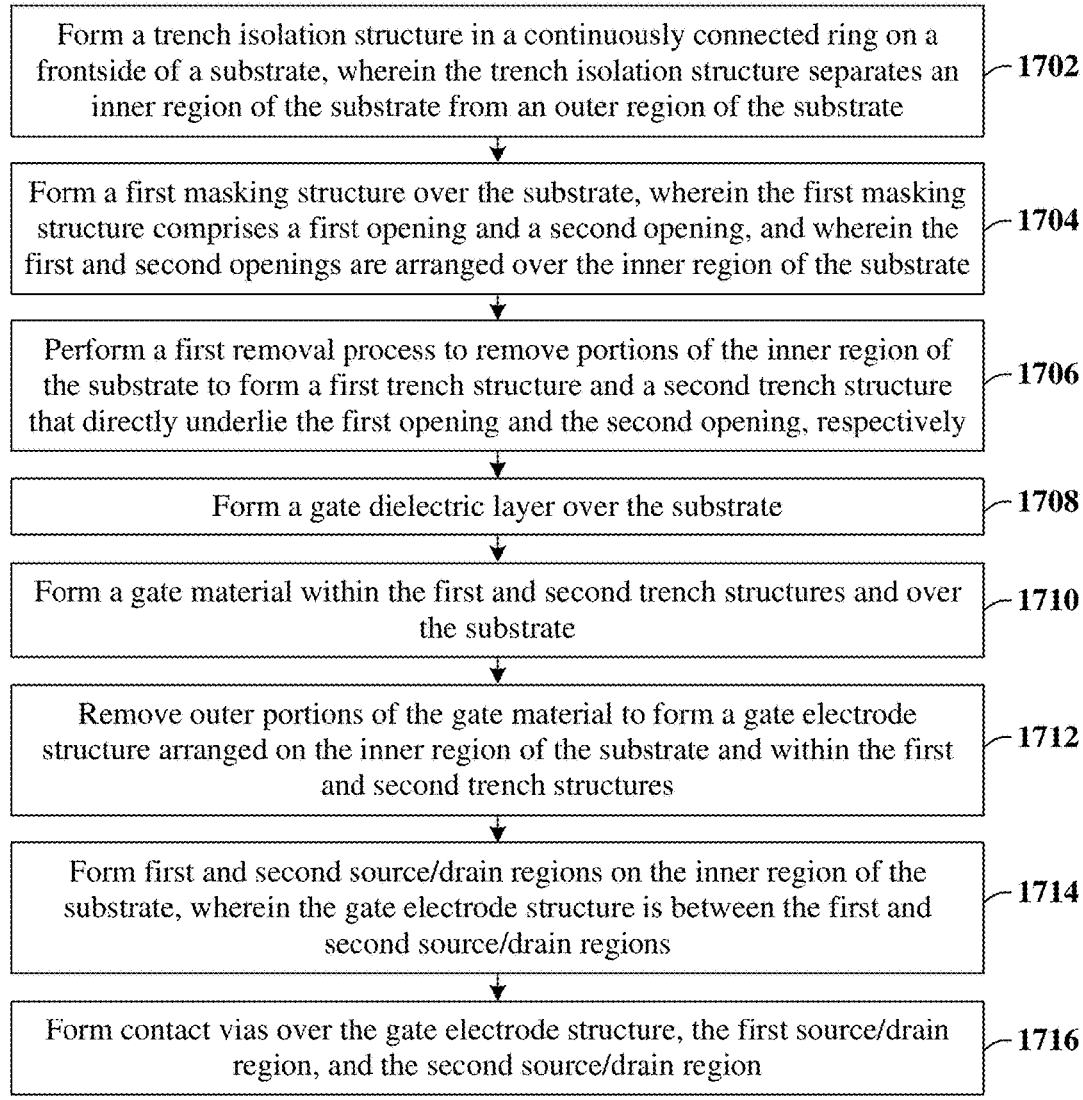
FIG. 17 illustrates a flow diagram of some embodiments corresponding to the method illustrated in FIGS. 6A-16C.

FIG. 17 illustrates a flow diagram of some embodiments of a method of FIG. 1700 of forming a vertical-gate transistor corresponding to FIGS. 6A-16C.

While method 1700 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At act 1702, a trench isolation structure is formed in a continuously connected ring on a frontside of a substrate. The trench isolation structure separates an inner region of the substrate from an outer region of the substrate. FIGS. 6A and 6B illustrate a cross-sectional view 600A and a top-view 600B, respectively, of some embodiments corresponding to act 1702.

At act 1704, a first masking structure is formed over the substrate and comprises a first opening and a second opening. The first and second openings are arranged over an inner region of the substrate. FIGS. 8A and 8B illustrate a cross-sectional view 800A and a top-view 800B, respectively, of some embodiments corresponding to act 1704.

At act 1706, a first removal process is performed to remove portions of the inner region of the substrate to form a first trench structure and a second trench structure that directly underlie the first opening and the second opening, respectively. FIGS. 9A and 9B illustrate a cross-sectional view 900A and a top-view 900B, respectively, of some embodiments corresponding to act 1706.

At act 1708, a gate dielectric layer is formed over the substrate. FIG. 10A illustrates a cross-sectional view 100A of some embodiments corresponding to act 1708.

At act 1710, a gate material is formed within the first and second trench structures and over the substrate. FIG. 11A illustrates a cross-sectional view 1100A of some embodiments corresponding to act 1710.

At act 1712, outer portions of the gate material are removed to form a gate electrode structure arranged on the inner region of the substrate and within the first and second trench structures. FIG. 12A illustrates a cross-sectional view 1200A of some embodiments corresponding to act 1712.

At act 1714, first and second source/drain regions are formed on the inner region of the substrate. The gate electrode structure is between the first and seconds source/drain regions. FIG. 15C illustrates a cross-sectional view 1500C of some embodiments corresponding to act 1714.

At act 1716, contact vias are formed over the gate electrode structure, the first source/drain region, and the second source/drain region. FIG. 17C illustrates a cross-sectional view 1700C of some embodiments corresponding to act 1716.

FIGS. 18A-22C illustrate various views 1800A-2200C of some embodiments of a method of forming a vertical-gate transistor having a gate electrode structure comprising first through fourth vertical portions extending from a horizontal portion. Although FIGS. 18A-22C are described in relation to a method, it will be appreciated that the structures disclosed in FIGS. 18A-22C are not limited to such a method, but instead may stand alone as structures independent of the method.

Figure 18A:
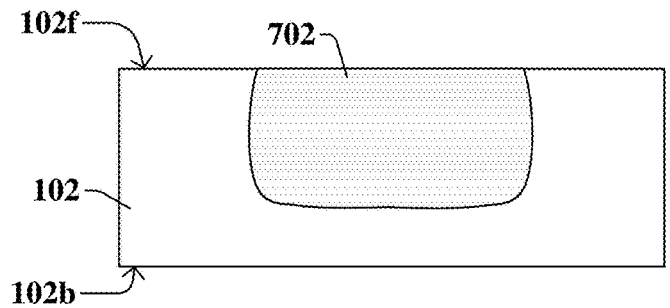
FIGS. 18A-22C illustrate various views of some embodiments of a method of forming an integrated chip having a gate electrode structure as illustrated in FIGS. 2A-2C.

As shown in cross-sectional view 1800A of FIG. 18A, in some embodiments, the doped well region 702 is formed within the frontside 102f of the substrate 102. Thus, in some embodiments, the doped well region 702 is formed prior to any type of trench isolation structure (e.g., 104 of FIG. 6A). In some embodiments, the substrate 102 has a first doping type (e.g., p-type or n-type), and the doped well region 702 is formed to increase the concentration of the first doping type. The doped well region 702 may be formed using photolithography and ion implantation processes. In other embodiments, the substrate 102 comprises the first doping type, and the doping concentration of the first doping type in the substrate 102 is sufficient. In such other embodiments, formation of the doped well region 702 is omitted.

Figure 18B:
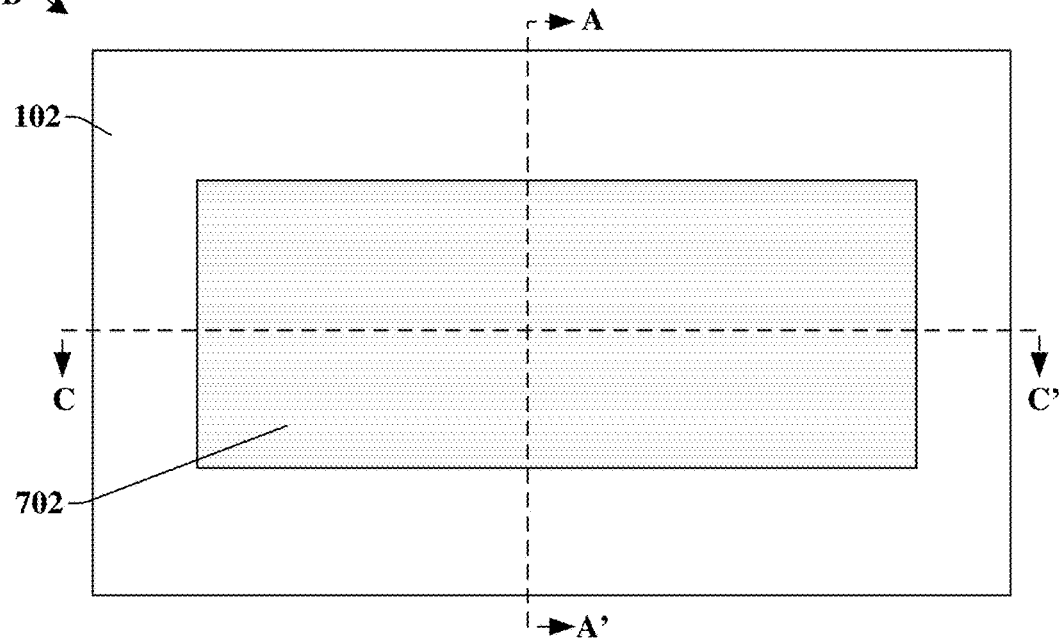

FIG. 18B illustrates a top-view 1800B of some embodiments corresponding to the cross-sectional view 1800A of FIG. 18A. In some embodiments, the cross-sectional view 1800A corresponds to cross-section line AA' of FIG. 18B. As illustrated in the top-view 1800B of FIG. 18B, in some embodiments, the doped well region 702 does not entirely cover the substrate 102.

Figure 18C:
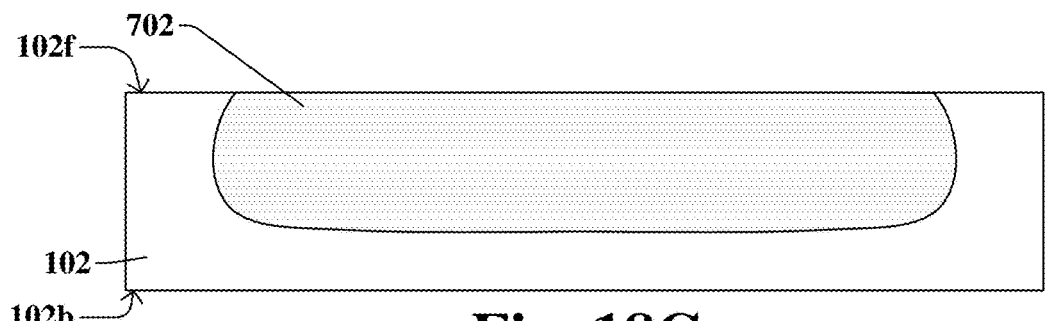

FIG. 18C illustrates a cross-sectional view 1800C of some embodiments corresponding to cross-section line CC' of FIG. 18B.

Figure 19A:
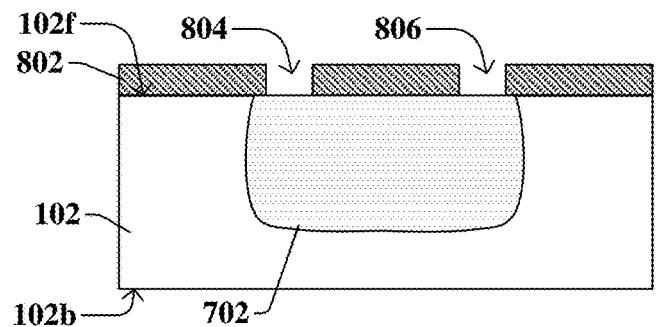

As shown in cross-sectional view 1900A of FIG. 19A, in some embodiments, a first masking structure 802 is formed over the frontside 102f of the substrate 102. The first masking structure 802 may comprise a first opening 804 and a second opening 806 from the cross-sectional view 1900A. In some embodiments, the first opening 804 of the first masking structure 802 directly overlies and exposes the doped well region 702, and the second opening 806 of the first masking structure 802 directly overlies and exposes the doped well region 702.

Figure 19B:
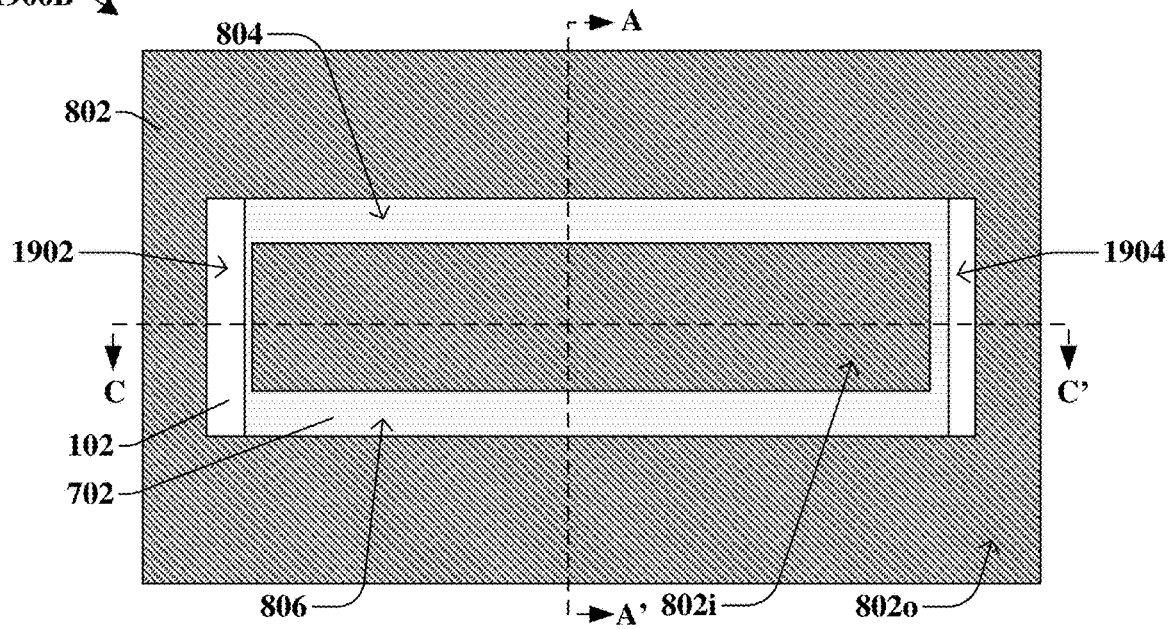

FIG. 19B illustrates a top-view 1900B of some embodiments corresponding to the cross-sectional view 1900A of FIG. 19A. In some embodiments, the cross-sectional view 1900A corresponds to cross-section line AA' of FIG. 19B.

As shown in the top-view 1900B, in some embodiments, the first opening 804 extends in a first direction to expose portions of the doped well region 702. Further, in some embodiments, the second opening 806 also extends in the first direction to expose portions of the doped well region 702. In some embodiments, the first and second openings 804, 806 may be substantially parallel to one another. Further, in some embodiments, the first masking structure 802 further comprises a third opening 1902 and a fourth opening 1904. In some embodiments, the third opening 1902 and the fourth opening 1904 extend in a second direction different than the first direction. The third and fourth openings 1902, 1904 directly overlie portions of the doped well region 702 and/or portions of the substrate 102, in some embodiments. Further, the third opening 1902 connects a first side of the first opening 804 to a first side of the second opening 806, and the fourth opening connects a second side of the first opening 804 to a second side of the second opening 806. Thus, in some embodiments, the first masking structure 802 comprises a continuously connected opening which includes the first, second, third, and fourth openings 804, 806, 1902, 1904. The continuously connected opening in the first masking structure 802 may separate an inner region 802i of the first masking structure 802 from an outer region 802o of the first masking structure 802, in some embodiments. It will be appreciated that other structures are also within the scope of the disclosure.

Figure 19C:
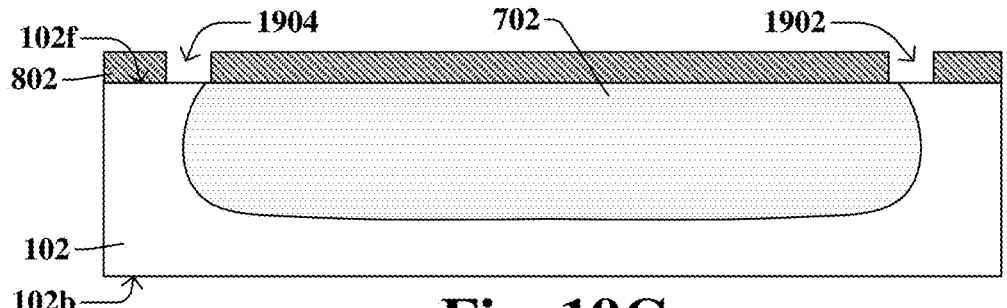

FIG. 19C illustrates a cross-sectional view 1900C of some embodiments corresponding to cross-section line CC' of FIG. 19B. In some embodiments, the first and/or second openings (804, 806 of FIG. 19A) are not visible from the perspective of the cross-sectional view 1900C. However, in some embodiments, the third and fourth openings 1902, 1904 of the first masking structure 802 are visible from the cross-sectional view 1900C.

Figure 20A:
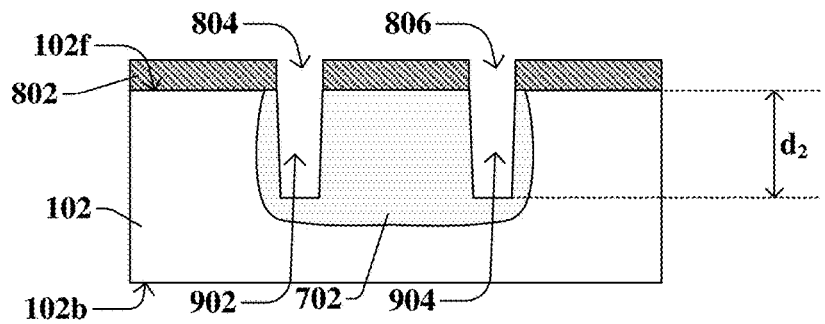

As shown in cross-sectional view 2000A of FIG. 20A, in some embodiments, the first removal process is performed to remove portions of the doped well region 702 and/or substrate 102 according to the first masking structure 802. After the first removal process is performed, a first trench structure 902 and a second trench structure 904 are formed according to the first opening 804 and the second opening 806, respectively, of the first masking structure 802. The first and second trench structures 902, 904 of FIG. 20A may be formed using a same or similar method and may comprise similar characteristics (e.g., measurement parameters) as the first and second trench structures 902, 904 of FIG. 9A. Further, it will be appreciated that other processes are within the scope of the disclosure.

Figure 20B:
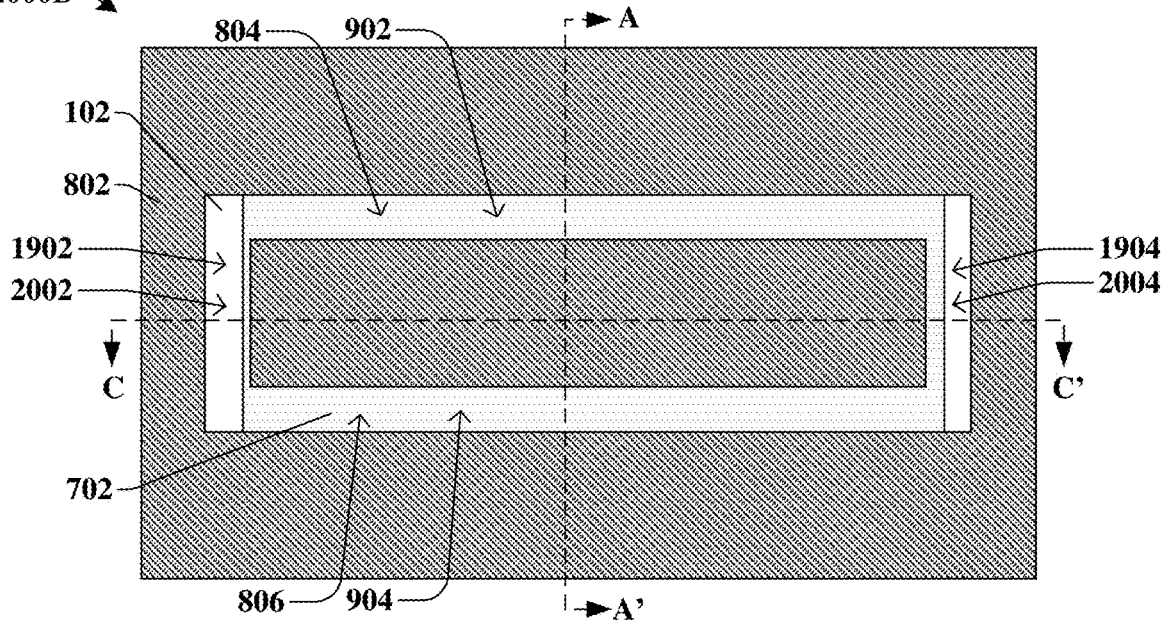

FIG. 20B illustrates a top-view 2000B of some embodiments corresponding to the cross-sectional view 2000A of FIG. 20A. In some embodiments, the cross-sectional view 2000A corresponds to cross-section line AA' of FIG. 20B.

In some embodiments, the top-view 2000B appears to comprise the same features as the top-view 2000B of FIG. 20B. However, it will be appreciated that the first and second trench structures 902, 904 are present directly below the first and second openings 804, 806, respectively, of the first masking structure 802. Further, a third trench structure 2002 and a fourth trench structure 2004 may be present directly below the third opening 1902 and the fourth opening 1904, respectively. Thus, the first removal process may form a continuously connected trench structures comprising the first, second, third, and fourth trench structures 902, 904, 2002, 2004.

Figure 20C:
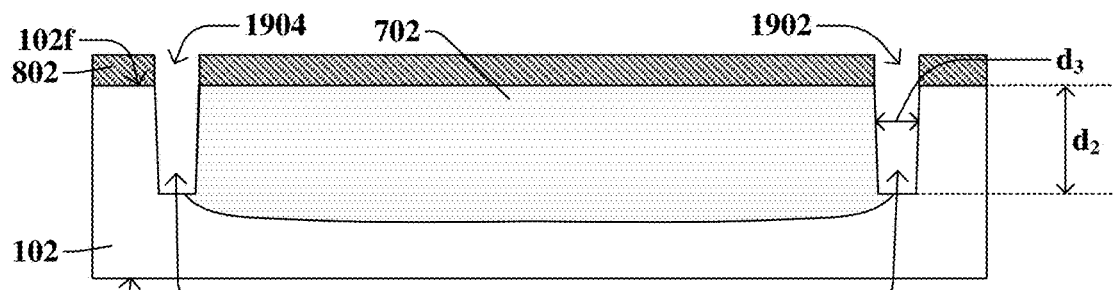

FIG. 20C illustrates a cross-sectional view 2000C of some embodiments corresponding to cross-section line CC' of FIG. 20B. In some embodiments, the first and/or second openings (804, 806 of FIG. 20A) and thus, the first and/or second trench structures (902, 904 of FIG. 20A) are not visible from the perspective of the cross-sectional view 2000C. In some embodiments, the third and fourth openings 1902, 1904, and thus, the third and fourth trench structures 2002, 2004 are visible from the cross-sectional view 2000C. In some embodiments, inner surfaces of the substrate 102 and the doped well region 702 define the third and fourth trench structures 2002, 2004. In other embodiments, inner surfaces of the substrate 102 or the doped well region 702 may define the third and fourth trench structures 2002, 2004. Further, in some embodiments, the third and fourth trench structures 2002, 2004 have a width equal to the third distance $d_3$, and the third and fourth trench structures 2002, 2004 may each extend into the frontside 102f of the substrate 102 to a depth equal to the second distance $d_2$. It will be appreciated that other values are also within the scope of the disclosure.

Figure 21A:
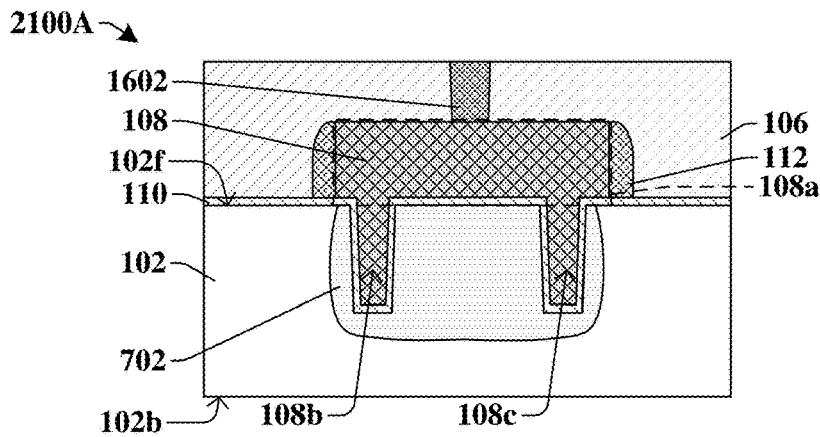
Figure 21B:
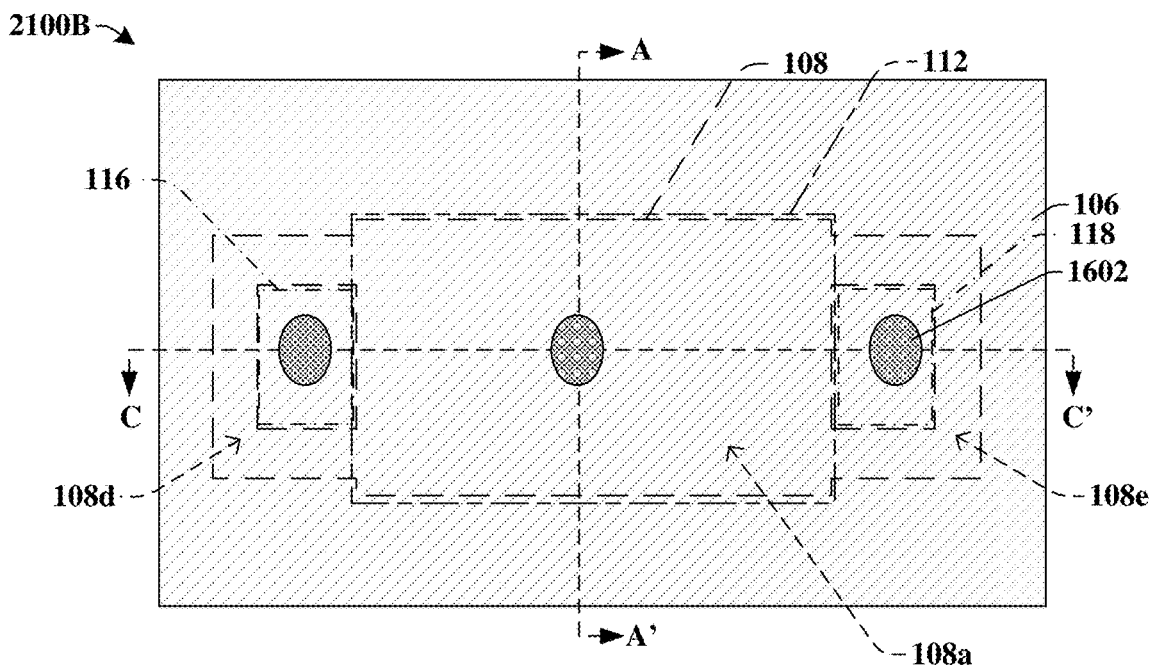
Figure 21C:
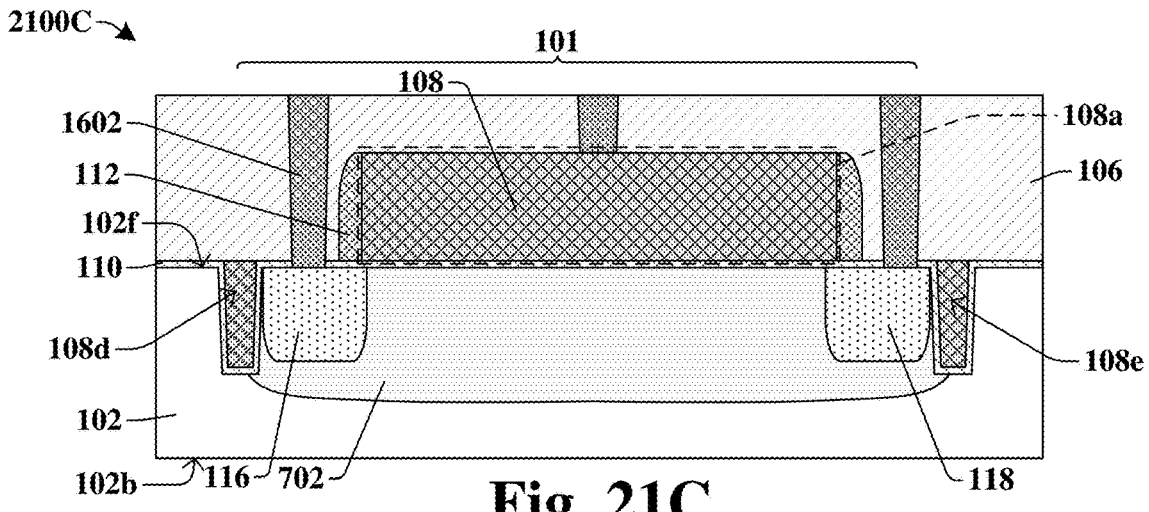

FIGS. 21A-21C illustrate various views 2100A-2100C of some embodiments of a vertical-gate transistor 101 after forming a gate dielectric layer 110, a gate electrode structure 108, a sidewall spacer structure 112, a dielectric structure 106, and contact vias 1602 over a substrate 102. It will be appreciated that the formation of the gate dielectric layer 110 in FIGS. 21A-21C may comprise the same or similar process as described regarding the gate dielectric layer 110 in FIGS. 10A-10C. Further, it will be appreciated that the formation of the gate electrode structure 108 in FIGS. 21A-21C may comprise the same or similar process as described regarding the gate electrode structure 108 formed in FIGS. 11A-12C. Also, it will be appreciated that the formation of the sidewall spacer structure 112 in FIGS. 21A-21C may comprise the same or similar process as described regarding the sidewall spacer structure 112 formed in FIGS. 13A-14C. Even further, it will be appreciated that the formation of the dielectric structure 106 and the contact vias 1602 in FIGS. 21A-21C may comprise the same or similar process as described regarding the dielectric structure 106 and the contact vias 1602 in FIGS. 16A-16C.

As seen in the cross-sectional view 2100C of FIG. 21C, because of the third and fourth trench structures (2002, 2004 of FIG. 20C), the gate electrode structure 108 of FIG. 21C also comprises third and fourth vertical portions 108d, 108e. The first source/drain region 116 may be arranged between the horizontal portion 108a of the gate electrode structure 108 and the third vertical portion 108d of the gate electrode structure 108. The second source/drain region 118 may be arranged between the horizontal portion 108a of the gate electrode structure 108 and the fourth vertical portion 108e of the gate electrode structure 108. In some embodiments, the first and second source/drain regions 116, 118 may be spaced apart from one another by a portion of the doped well region 702. It will be appreciated that other structures are also within the scope of the disclosure.

Figure 22A:
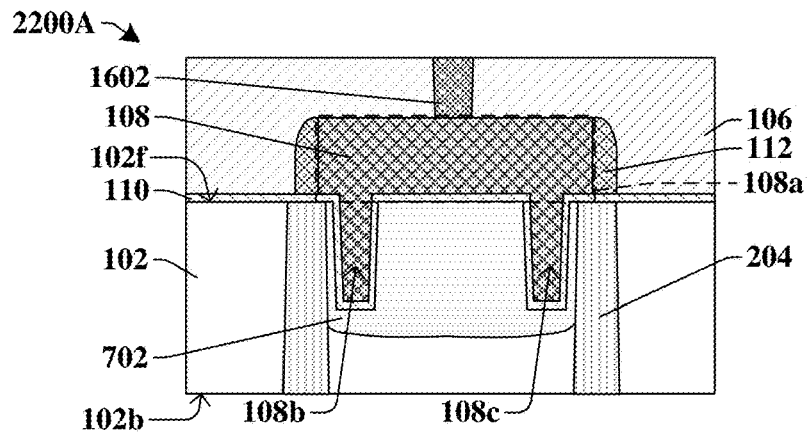

As shown in cross-sectional view 2200A of FIG. 22A, in some embodiments, after the formation of the gate electrode structure 108, a heavily doped region 204 may be formed that extends through the substrate 102. In some embodiments, the heavily doped region 204 is formed from the backside 102b of the substrate 102 to the frontside 102f of the substrate 102. In some embodiments, the heavily doped region 204 has a higher doping concentration than the substrate 102. Thus, in some embodiments, the heavily doped region 204 has a same doping type as, but higher doping concentration than the substrate 102. In some embodiments, the heavily doped region 204 is formed by an ion implantation process. In such embodiments, the heavily doped region 204 may comprise doped silicon. In other embodiments, the heavily doped region 204 may also be formed by way of removal (e.g., etching) and deposition processes. For example, in such other embodiments, the heavily doped region 204 may comprise doped polysilicon. It will be appreciated that other processing steps, materials, and/or structures of the heavily doped region 204 are also within the scope of the disclosure.

Figure 22B:
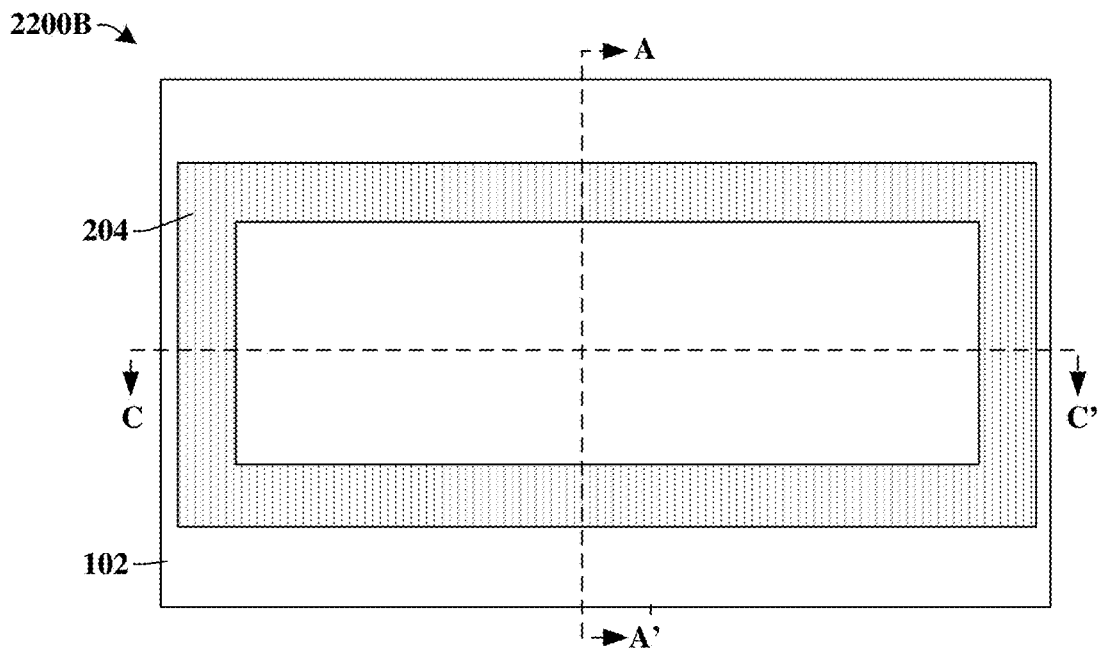

FIG. 22B illustrates a back-view 2200B of some embodiments corresponding to the cross-sectional view 2200A of FIG. 22A. In some embodiments, the cross-sectional view 2200A corresponds to cross-section line AA' of FIG. 22B. In some embodiments, from the back-view 2200B, the heavily doped region 204 is in a continuously connected ring-like shape. It will be appreciated that other structures are also within the scope of the disclosure.

Figure 22C:
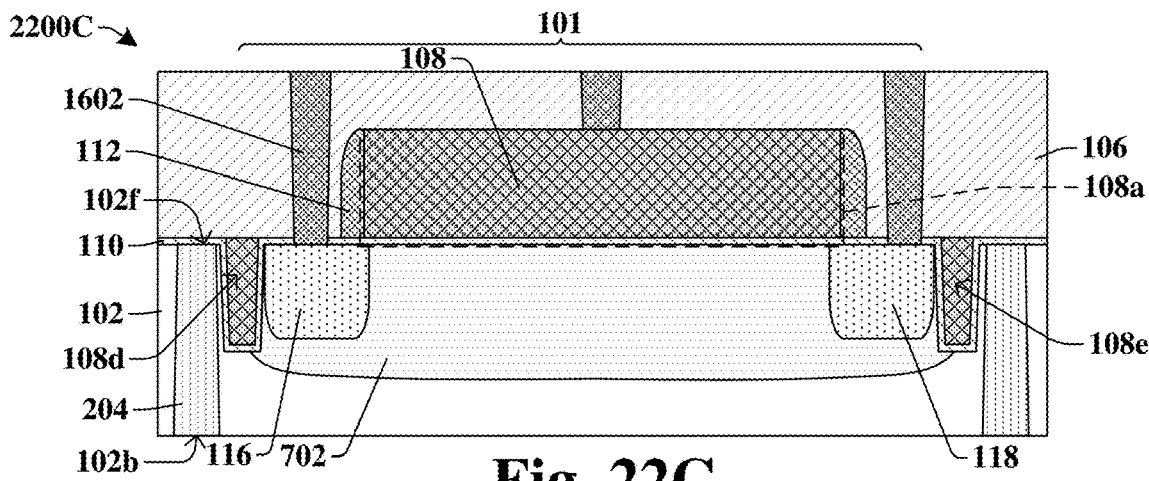

FIG. 22C illustrates a cross-sectional view 2200C of some embodiments corresponding to cross-section line CC' of FIG. 22B. In some embodiments, the heavily doped region 204 surrounds outer sidewalls of the third and fourth vertical portions 108d, 108e of the gate electrode structure 108. Thus, when the vertical-gate transistor 101 is turned "ON," leakage of current between the first source/drain region 116, the second source/drain region 118, and the gate electrode structure 108 may be prevented by the heavily doped region 204.

FIG. 23 illustrates a flow diagram of some embodiments of a method of FIG. 2300 of forming a vertical-gate transistor corresponding to FIGS. 18A-22C.

While method 2300 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At act 2302, a first masking structure is formed over a substrate. An opening in the first masking structure completely separates an inner region from an outer region of the first masking structure. FIGS. 19A and 19B illustrate a cross-sectional view 1900A and a top-view 1900B, respectively, of some embodiments corresponding to act 2302.

At act 2304, a first removal process is performed to remove portions substrate that directly underlie the opening of the first masking structure to form a trench structure in the substrate. FIGS. 20A and 20B illustrate a cross-sectional view 2000A and a top-view 2000B, respectively, of some embodiments corresponding to act 2304.

At act 2306, a gate dielectric layer is formed over the substrate.

At act 2308, a gate electrode structure is formed within the trench structure and over the trench structure.

At act 2310, first and second source/drain regions are formed on the substrate.

At act 2312, contact vias are formed over the gate electrode structure, the first source/drain region, and the second source/drain region. FIG. 21A illustrates a cross-sectional view 2100A of some embodiments corresponding to acts 2306, 2308, 2310, and 2312.

At act 2314, a heavily doped region is formed that continuously surrounds the gate electrode structure and extends from a backside of the substrate to a frontside of the substrate. FIGS. 22A, 22B, and 22C illustrate a cross-sectional view 2200A, a back-view 2200B, and a cross-sectional view 2200C, respectively, of some embodiments corresponding to act 2314.

Therefore, the present disclosure relates to a method of forming a gate electrode structure comprising at least a horizontal portion, a first vertical portion, and a second vertical portion to reduce noise and thus, increase the reliability of a final transistor device.

Accordingly, in some embodiments, the present disclosure relates to a device, comprising: a semiconductor substrate including a frontside and a backside; a first source/drain region and a second source/drain region on the frontside of the semiconductor substrate; a gate electrode structure arranged over the frontside of the semiconductor substrate and comprising: a horizontal portion arranged over the frontside of the semiconductor substrate and between the first source/drain region and the second source/drain region; a first vertical portion extending from the frontside of the semiconductor substrate towards the backside of the semiconductor substrate in a first direction and contacting the horizontal portion of the gate electrode structure; and a second vertical portion extending from the frontside of the semiconductor substrate towards the backside of the semiconductor substrate in the first direction, contacting the horizontal portion of the gate electrode structure, and separated from the first vertical portion by a channel region of the semiconductor substrate.

In other embodiments, the present disclosure relates to a device, comprising: a semiconductor substrate including a frontside and a backside; a first source/drain region disposed in the semiconductor substrate; a second source/drain region disposed in the semiconductor substrate and spaced apart from the first source/drain region; a gate electrode structure arranged over the first source/drain region and the second source/drain region and comprising: a horizontal portion extending over the frontside of the semiconductor substrate; a first vertical portion extending from the frontside of the semiconductor substrate to a first depth below the frontside of the semiconductor substrate; and a second vertical portion extending from the frontside of the semiconductor substrate to a second depth below the frontside of the semiconductor substrate; and a trench isolation structure in the semiconductor substrate and surrounding the gate electrode structure.

In yet other embodiments, the present disclosure relates to a method comprising: forming a first masking structure over a substrate, wherein the first masking structure comprises a first opening and a second opening, the first and second openings extending in parallel with one another; removing portions of the substrate that directly underlie the first and second openings; removing the first masking structure; forming a gate dielectric layer over the substrate; forming a gate electrode material over the gate dielectric layer; removing outer portions of the gate electrode material to form a gate electrode structure comprising a horizontal portion, a first vertical portion, and a second vertical portion; forming first and second source/drain regions in the substrate; and forming an isolation structure within the substrate and surrounding the first source/drain region, the second source/drain region, and the gate electrode structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device, comprising:
a semiconductor substrate;
a first source/drain region disposed within the semiconductor substrate;
a second source/drain region disposed within the semiconductor substrate and spaced apart from the first source/drain region in a first direction by a channel region of the semiconductor substrate;
a horizontal gate electrode structure extending over a frontside of the semiconductor substrate, the horizontal gate electrode structure having a set of outer sidewalls separated from one another in a second direction perpendicular to the first direction;
a first vertical gate electrode structure extending downward from the horizontal gate electrode structure and into the semiconductor substrate, the first vertical gate electrode structure extending in the first direction along a first side of the channel region;
a second vertical gate electrode structure extending downward from the horizontal gate electrode structure and into the semiconductor substrate, wherein an inner sidewall of the second vertical gate electrode structure is spaced apart from an inner sidewall of the first vertical gate electrode structure, and the second vertical gate electrode structure extends in the first direction along a second side of the channel region;
a third vertical gate electrode structure extending from the frontside of the semiconductor substrate towards a backside of the semiconductor substrate, wherein a first side of the first vertical gate electrode structure is connected to a first side of the second vertical gate electrode structure by the third vertical gate electrode structure; and
wherein the set of outer sidewalls of the horizontal gate electrode structure extend outwardly in the second direction past outermost sidewalls of the first vertical gate electrode structure and the second vertical gate electrode structure.

2. The device of claim 1, further comprising:
a fourth vertical gate electrode structure extending from the frontside of the semiconductor substrate towards the backside of the semiconductor substrate, wherein a second side of the first vertical gate electrode structure is connected to a second side of the second vertical gate electrode structure by the fourth vertical gate electrode structure and wherein the third and fourth vertical gate electrode structures do not directly underlie the horizontal gate electrode structure.

3. The device of claim 1, wherein the first vertical gate electrode structure is separated from an outer sidewall of the horizontal gate electrode structure in the first direction by the first source/drain region.

4. The device of claim 1, wherein the first vertical gate electrode structure extends laterally in the first direction along a first side of the first source/drain region.

5. The device of claim 1, wherein the first vertical gate electrode structure extends to a depth into the semiconductor substrate that is greater than a lowermost depth of the first source/drain region.

6. The device of claim 1, further comprising:
a shallow trench isolation (STI) region extending into the semiconductor substrate and laterally surrounding the first source/drain region, the second source/drain region, and the channel region; and
wherein the channel region has an upper surface that is co-planar with an upper surface of the STI region.

7. The device of claim 1, further comprising:
a shallow trench isolation (STI) region extending into the semiconductor substrate and laterally surrounding the first source/drain region, the second source/drain region, and the channel region;
wherein an outer edge of the horizontal gate electrode structure extends at least partially over an upper surface of the STI region.

8. A device, comprising:
a semiconductor substrate having an upper face and a lower face;
a shallow trench isolation (STI) region extending into the upper face of the semiconductor substrate and laterally surrounding an active area of the semiconductor substrate;
a first source/drain region disposed within the active area;
a second source/drain region disposed within the active area and spaced apart from the first source/drain region in a first direction;
a channel region disposed within the active area and arranged between the first source/drain region and the second source/drain region, wherein the channel region has an upper surface that is co-planar with an upper surface of the STI region;
a horizontal gate electrode structure extending over a frontside of the semiconductor substrate and over the channel region;
a first vertical gate electrode structure extending downward from the horizontal gate electrode structure and into the semiconductor substrate, the first vertical gate electrode structure extending in the first direction along a first side of the channel region; and
a second vertical gate electrode structure extending downward from the horizontal gate electrode structure and into the semiconductor substrate, the second vertical gate electrode structure spaced apart from the first vertical gate electrode structure and extending in the first direction along a second side of the channel region.

9. The device of claim 8, further comprising:
a third vertical gate electrode structure extending from the frontside of the semiconductor substrate towards a backside of the semiconductor substrate, wherein a first side of the first vertical gate electrode structure is connected to a first side of the second vertical gate electrode structure by the third vertical gate electrode structure.

10. The device of claim 9, further comprising:
a fourth vertical gate electrode structure extending from the frontside of the semiconductor substrate towards the backside of the semiconductor substrate, wherein a second side of the first vertical gate electrode structure is connected to a second side of the second vertical gate electrode structure by the fourth vertical gate electrode structure and wherein the third and fourth vertical gate electrode structures do not directly underlie the horizontal gate electrode structure.

11. The device of claim 8, wherein the first vertical gate electrode structure is separated from an outer sidewall of the horizontal gate electrode structure in the first direction by the first source/drain region.

12. The device of claim 8, wherein the first vertical gate electrode structure extends laterally in the first direction along a first side of the first source/drain region.

13. The device of claim 8, wherein the first vertical gate electrode structure extends to a depth into the semiconductor substrate that is greater than a lowermost depth of the first source/drain region.

14. The device of claim 8, wherein the at least one of the first source/drain region and the second source/drain region has an upper surface that is co-planar with the upper surface of the STI region.

15. A device, comprising:
a semiconductor substrate having an upper face and a lower face;
a shallow trench isolation (STI) region extending into the upper face of the semiconductor substrate and laterally surrounding an active area of the semiconductor substrate;
a first source/drain region disposed within the active area;
a second source/drain region disposed within the active area and spaced apart from the first source/drain region in a first direction by a channel region, wherein an upper surface of second source/drain region is co-planar with an upper surface of the STI region;
a horizontal gate electrode structure extending over a frontside of the semiconductor substrate;
a first vertical gate electrode structure extending downward from the horizontal gate electrode structure and into the semiconductor substrate, the first vertical gate electrode structure extending in the first direction along a first side of the channel region;
a second vertical gate electrode structure extending downward from the horizontal gate electrode structure and into the semiconductor substrate, the second vertical gate electrode structure spaced apart laterally from the first vertical gate electrode structure by a region of the semiconductor substrate and extending in the first direction along a second side of the channel region; and
a third vertical gate electrode structure extending from the frontside of the semiconductor substrate towards a backside of the semiconductor substrate, wherein a first side of the first vertical gate electrode structure is connected to a first side of the second vertical gate electrode structure by the third vertical gate electrode structure.

16. The device of claim 15, further comprising:
a fourth vertical gate electrode structure extending from the frontside of the semiconductor substrate towards the backside of the semiconductor substrate, wherein a second side of the first vertical gate electrode structure is connected to a second side of the second vertical gate electrode structure by the fourth vertical gate electrode structure and wherein the third and fourth vertical gate electrode structures do not directly underlie the horizontal gate electrode structure.

17. The device of claim 15, wherein the first vertical gate electrode structure is separated from an outer sidewall of the horizontal gate electrode structure in the first direction by the first source/drain region.

18. The device of claim 15, wherein the first vertical gate electrode structure extends laterally in the first direction along a first side of the first source/drain region.

19. The device of claim 15, wherein the first vertical gate electrode structure extends to a depth into the semiconductor substrate that is greater than a lowermost depth of the first source/drain region.

20. The device of claim 15, wherein an outer edge of the horizontal gate electrode structure extends at least partially over the upper surface of the STI region.

* * * * *